US012796084B2

(12) United States Patent
Wang et al.

(10) Patent No.: US 12,796,084 B2
(45) Date of Patent: Nov. 10, 2026

(54) ARRAY SUBSTRATE AND METHOD FOR MANUFACTURING SAME, AND DISPLAY PANEL

(71) Applicants: Beijing BOE Technology Development Co., Ltd., Beijing (CN); BOE Technology Group Co., Ltd., Beijing (CN)

(72) Inventors: Lizhong Wang, Beijing (CN); Ce Ning, Beijing (CN); Hui Guo, Beijing (CN); Kun Yang, Beijing (CN); Jinchao Zhang, Beijing (CN); Tianmin Zhou, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 260 days.

(21) Appl. No.: 18/706,139

(22) PCT Filed: Jul. 31, 2023

(86) PCT No.: PCT/CN2023/110358

§ 371 (c)(1),
(2) Date: Apr. 30, 2024

(87) PCT Pub. No.: WO2025/025097

PCT Pub. Date: Feb. 6, 2025

(65) Prior Publication Data

US 2026/0136668 A1 May 14, 2026

(51) Int. Cl.
*H10D 86/40* (2025.01)
*G02F 1/1335* (2006.01)
(Continued)

(52) U.S. Cl.
CPC ..... *H10D 86/441* (2025.01); *G02F 1/133514* (2013.01); *G02F 1/133553* (2013.01);
(Continued)

(58) Field of Classification Search
CPC ......... G02F 1/133514; G02F 1/133553; G02F 1/136209; G02F 1/136286; H10D 86/441; H10D 86/021
See application file for complete search history.

(56) References Cited

U.S. PATENT DOCUMENTS

2014/0192515 A1* 7/2014 Kim .................. G02F 1/133512
362/97.1
2017/0184915 A1* 6/2017 Yang .................. G02F 1/13394
2024/0295786 A1* 9/2024 Meng ................ G02F 1/133536

FOREIGN PATENT DOCUMENTS

CN 101840100 A 9/2010
CN 104793395 A 7/2015
(Continued)

*Primary Examiner* — Nathanael R Briggs
(74) *Attorney, Agent, or Firm* — XSENSUS LLP

(57) ABSTRACT

Provided is an array substrate. The array substrate includes a base; a light-reflective pattern disposed on the base, a plurality of first gate signal lines disposed on a side of the light-reflective pattern away from the base; and a plurality of data signal lines disposed on a side of the plurality of first gate signal lines away from the base. The light-reflective pattern includes a plurality of reflective portions, and an opening region is defined between two adjacent reflective portions of the plurality of reflective portions. An orthographic projection of the first gate signal line on the base and an orthographic projection of the data signal line on the base have a first overlapping region, and at least one first overlapping region of a plurality of first overlapping regions is within an orthographic projection of the reflective portion on the base.

19 Claims, 23 Drawing Sheets

(51) Int. Cl.
*G02F 1/1362* (2006.01)
*H10D 86/01* (2026.01)

(52) U.S. Cl.
CPC .. *G02F 1/136209* (2013.01); *G02F 1/136286* (2013.01); *H10D 86/021* (2025.01)

(56) References Cited

FOREIGN PATENT DOCUMENTS

| | | | | | |
|---|---|---|---|---|---|
| CN | 106057909 | A | | 10/2016 | |
| CN | 107302032 | A | | 10/2017 | |
| CN | 107422555 | A | | 12/2017 | |
| CN | 109786323 | A | | 5/2019 | |
| CN | 110412791 | A | | 11/2019 | |
| CN | 110858035 | A | | 3/2020 | |
| CN | 112987387 | A | | 6/2021 | |
| CN | 112987423 | A | * | 6/2021 | ....... G02F 1/133614 |

* cited by examiner

ARRAY SUBSTRATE AND METHOD FOR MANUFACTURING SAME, AND DISPLAY PANEL

CROSS-REFERENCE TO RELATED APPLICATION

The application is a U.S. national stage of international application No. PCT/CN2023/110358, filed on Jul. 31, 2023, the content of which is herein incorporated by reference in its entirety.

TECHNICAL FIELD

The present disclosure relates to the field of display technologies, and in particular relates to an array substrate and a method for manufacturing the same, and a display panel.

BACKGROUND

A display panel generally includes an array substrate, and the array substrate is a device for controlling the display panel.

SUMMARY

Embodiments of the present disclosure provide an array substrate and a method for manufacturing the same, and a display panel. The technical solutions are as follows.

According to some embodiments of the present disclosure, an array substrate is provided. The array substrate includes:

a base;

a light-reflective pattern disposed on the base, wherein the light-reflective pattern includes a plurality of reflective portions, and an opening region is defined between two adjacent reflective portions of the plurality of reflective portions;

a plurality of first gate signal lines disposed on a side of the light-reflective pattern away from the base; and a plurality of data signal lines disposed on a side of the plurality of first gate signal lines away from the base;

wherein an orthographic projection of the first gate signal line on the base and an orthographic projection of the data signal line on the base have a first overlapping region, and at least one first overlapping region of a plurality of first overlapping regions is within an orthographic projection of the reflective portion on the base.

In some embodiments, the array substrate further includes: a buffer layer, a second active layer pattern, a first gate insulating layer, a plurality of second gate signal lines, a first interlayer dielectric layer, and a first active layer pattern which are disposed between the plurality of first gate signal lines and the light-reflective pattern; wherein the buffer layer, the second active layer pattern, the first gate insulating layer, the plurality of second gate signal lines, the first interlayer dielectric layer, and the first active layer pattern are laminated in a direction going away from the base.

In some embodiments, the array substrate further includes: a light-shielding pattern disposed between the light-reflective pattern and the first active layer pattern; wherein the first active layer pattern includes a plurality of first active layers, wherein the first active layer has a channel region, and an orthographic projection of the channel region on the base is within an orthographic projection of the light-shielding pattern on the base; and the orthographic projection of the light-shielding on the base overlaps with an orthographic projection of the light-reflective pattern on the base.

In some embodiments, a material of the light-reflective pattern includes at least one of molybdenum, aluminum, titanium and argentum, and a thickness of the light-reflective pattern ranges from 50 angstroms to 2000 angstroms.

In some embodiments, the array substrate further includes: a buffer layer, a second active layer pattern, a first gate insulating layer, a plurality of second gate signal lines, a first interlayer dielectric layer, and a first active layer pattern which are disposed on a side of the plurality of first gate signal lines close to the base; wherein the buffer layer, the second active layer pattern, the first gate insulating layer, the plurality of second gate signal lines, the first interlayer dielectric layer and the first active layer pattern are laminated in a direction going away from the base; and the light-reflective pattern and the plurality of second gate signal lines are disposed in a same layer.

In some embodiments, a material of the light-reflective pattern includes at least one of molybdenum, aluminum and titanium, and a thickness of the light-reflective pattern ranges from 1500 angstroms to 6000 angstroms.

In some embodiments, the plurality of reflective portions are arranged in an array, the data signal line extends along a first direction, the plurality of data signal lines are arranged along a second direction, the first gate signal line extends along the second direction, and the plurality of first gate signal lines are arranged along the first direction;

the plurality of reflective portions satisfy the following formula:

$$L_1 = n \times H;$$

$$L_2 = 3n \times W;$$

wherein $L_1$ represents a distance between centers of two reflective portions adjacent in the first direction, H represents a shortest distance between centers of two adjacent first gate signal lines in the first direction, and n is a positive integer greater than or equal to 1; and $L_2$ represents a distance between centers of two reflective portions adjacent in the second direction, and W represents a shortest distance between centers of two adjacent data signal lines in the second direction.

In some embodiments, the plurality of first gate signal lines and the plurality of data signal lines satisfy the following formula:

$$D_1 / D_2 \geq 1.3;$$

wherein $D_1$ represents a distance between two adjacent first gate signal lines, and $D_2$ represents a distance between two adjacent data signal lines.

In some embodiments, the plurality of reflective portions are arranged in a plurality of rows, the plurality of rows of reflective portions are arranged along a first direction, and the plurality of reflective portions in one row of reflective portions are arranged along a second direction, wherein the first direction is an extension direction of the data signal line, and the second direction is an extension direction of the first gate signal line; and the plurality of reflective portions in two adjacent rows of reflective portions are arranged in a staggered manner.

In some embodiments, the plurality of reflective portions are arranged in a plurality of rows, the plurality rows of reflective portions are arranged along a first direction, and the plurality of reflective portions in one row of reflective portions are arranged along a second direction, wherein the first direction is an extension direction of the data signal line, and the second direction is an extension direction of the first gate signal line;

one row of reflective portions includes a plurality of first reflective portions and a plurality of second reflective portions, and the plurality of first reflective portions and the plurality of second reflective portions are arranged alternately along the second direction;

the first overlapping region has a first side and a second side opposite to each other in the first direction, wherein a center of an orthographic projection of the first reflective portion on the base is at the first side of a center of the first overlapping region, and a center of an orthographic projection of the second reflective portion on the base is at the second side of the center of the first overlapping region.

In some embodiments, a shape of the orthographic projection of the reflective portion on the base includes at least one of a circle, an ellipse, a square and a square hexagon.

In some embodiments, the orthographic projection of the reflective portion on the base is rectangular in shape, the plurality of reflective portions are in one-to-one correspondence with the plurality of first overlapping regions, and the first overlapping region is in the orthographic projection of the corresponding reflective portion on the base; and a difference value between a width of the reflective portion in a first direction and a width of the first overlapping region in the first direction ranges from 1 μm to 8 μm, and a difference value between a width of the reflective portion in a second direction and a width of the first overlapping region in the second direction ranges from 1 μm to 6 μm;

wherein the first direction is an extension direction of the data signal line, and the second direction is an extension direction of the first gate signal line.

In some embodiments, the plurality of reflective portions are arranged in a plurality of rows, the plurality of rows of reflective portions are arranged along the first direction, and the plurality of reflective portions in one row of reflective portions are arranged along the second direction;

the light-reflective pattern further includes a plurality of connection portions, wherein the connection portion is disposed between two adjacent reflective portions in one row of reflective portions and is connected to the two adjacent reflective portions; and an orthographic projection of the connection portion on the base is within an orthographic projection of the first gate signal line on the base.

In some embodiments, the reflective portion includes a reflective portion body and two first protruding structures, wherein the two first protruding structures are respectively disposed on two sides of the reflective portion body in the second direction, and an opening region is defined between the first protruding structures of two reflective portions adjacent in the second direction; and an orthographic projection of the first protruding structure on the base is within the orthographic projection of the first gate signal line on the base.

In some embodiments, the plurality of reflective portions are arranged in a plurality of rows, the plurality of rows of reflective portions are arranged along the first direction, and the plurality of reflective portions in one row of reflective portions are arranged along the second direction;

one row of reflective portions includes a plurality of reflective portion units, and each of the plurality of reflective portion units includes a plurality of reflective portions; and in two adjacent reflective portion units, the reflective portions in one reflective portion unit have a first length in the first direction, and the reflective portions in the other reflective portion unit have a second length in the first direction, the first length being greater than the second length.

In some embodiments, the plurality of reflective portions include a plurality of reflective portion groups, one reflective portion group includes two rows of reflective portions, the plurality of reflective portion groups are arranged along a first direction, the two rows of reflective portions in one reflective portion group are arranged along the first direction, and the plurality of reflective portions in one row of reflective portions are arranged along a second direction, wherein the first direction is an extension direction of the data signal line, and the second direction is an extension direction of the first gate signal line; and in one reflective portion group, orthographic projections of the plurality of reflective portions in one row of reflective portions on the base are circular in shape, and orthographic projections of the plurality of reflective portions in the other row of reflective portions on the base are rectangular in shape.

According to some embodiments of the present disclosure, a method for manufacturing an array substrate is provided. The method includes:

forming a light-reflective pattern on a base, wherein the light-reflective pattern includes a plurality of reflective portions, and an opening region is defined between two adjacent reflective portions of the plurality of reflective portions;

forming a plurality of first gate signal lines on the base on which the light-reflective pattern is formed; and forming a plurality of first data signal lines on the base on which the plurality of first gate signal lines are formed;

wherein an orthographic projection of the first gate signal line on the base and an orthographic projection of the data signal line on the base have a first overlapping region, and an orthographic projection of the reflective portion on the base overlaps with the first overlapping region.

According to some embodiments of the present disclosure, a display panel is provided. The display panel includes: an array substrate and a color film substrate facing each other, and a liquid crystal layer disposed between the array substrate and the color film substrate, wherein the array substrate is the array substrate described above.

In some embodiments, the display panel further includes: a plurality of support portions disposed between the array substrate and the color film substrate, wherein an orthographic projection of at least one support portion of the plurality of support portions on the base is within the orthographic projection of the reflective portion on the base.

In some embodiments, the color film substrate includes a plurality of red color resistance blocks, a plurality of blue color resistance blocks and a plurality of green color resistance blocks; wherein the orthographic projection of the reflective portion on the base overlaps with an orthographic projection of at least one red color resistance block of the plurality of red color resistance blocks on the base, the orthographic projection of the reflective portion on the base overlaps with an orthographic projection of at least one blue color resistance block of the plurality of blue color resistance blocks on the base, and the orthographic projection of the reflective portion on the base is staggered with orthographic projections of the green color resistance blocks on the base.

BRIEF DESCRIPTION OF DRAWINGS

For a clearer description of the technical solutions in the embodiments of the present disclosure, the following briefly introduces the accompanying drawings required for describing the embodiments. The accompanying drawings in the following descriptions show merely some embodiments of the present disclosure, and persons of ordinary skill in the art may still derive other drawings from these accompanying drawings without creative effort.

Specific embodiments of the present disclosure have been shown by means of the above accompanying drawings and will be described in more detail hereinafter. These accompanying drawings and textual descriptions are not intended to limit the scope of the concepts of the present disclosure in any way, but rather to illustrate the concepts of the present disclosure for those skilled in the art by reference to particular embodiments.

DETAILED DESCRIPTION

To make the objectives, technical solutions and advantages of the present disclosure clearer, the embodiments of the present disclosure will be further described in detail below with reference to the accompanying drawings.

In some practices, a display panel includes a backlight structure, an array substrate, and a color film substrate which are laminated, and a liquid crystal layer disposed between the array substrate and the color film substrate. The array substrate includes a base and a plurality of thin-film transistors (TFT) disposed on the base, and further includes a plurality of pixel electrodes which are electrically connected to the plurality of TFTs in one-to-one correspondence, and a gate signal line and a data signal line.

However, the above array substrate has a low light transmittance, resulting in a poor display effect of the display panel provided with the array substrate.

Figure 1:
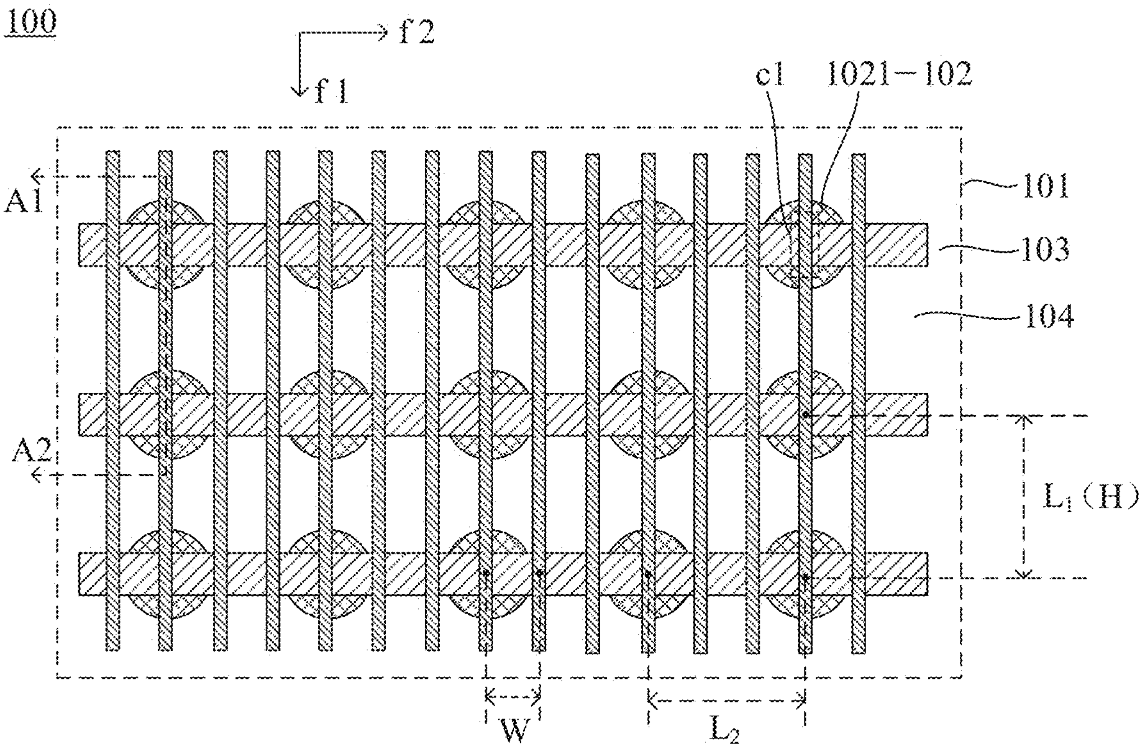
FIG. 1 is a schematic structural diagram of an array substrate according to some embodiments of the present disclosure
Figure 2:
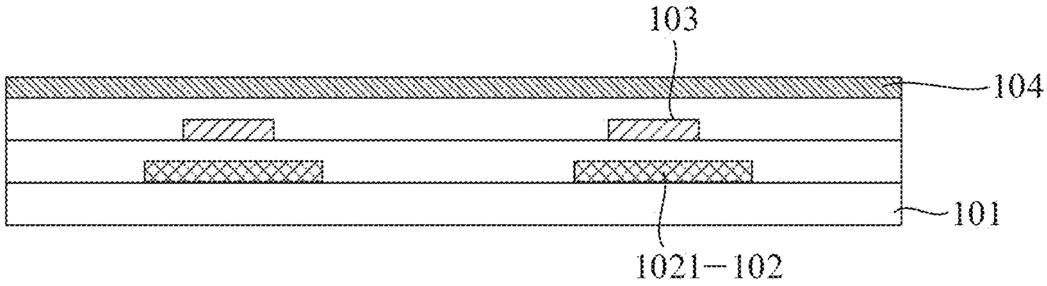
FIG. 2 is a schematic diagram of a cross-sectional structure along A1-A2 of the array substrate shown in FIG. 1.
Figure 3:
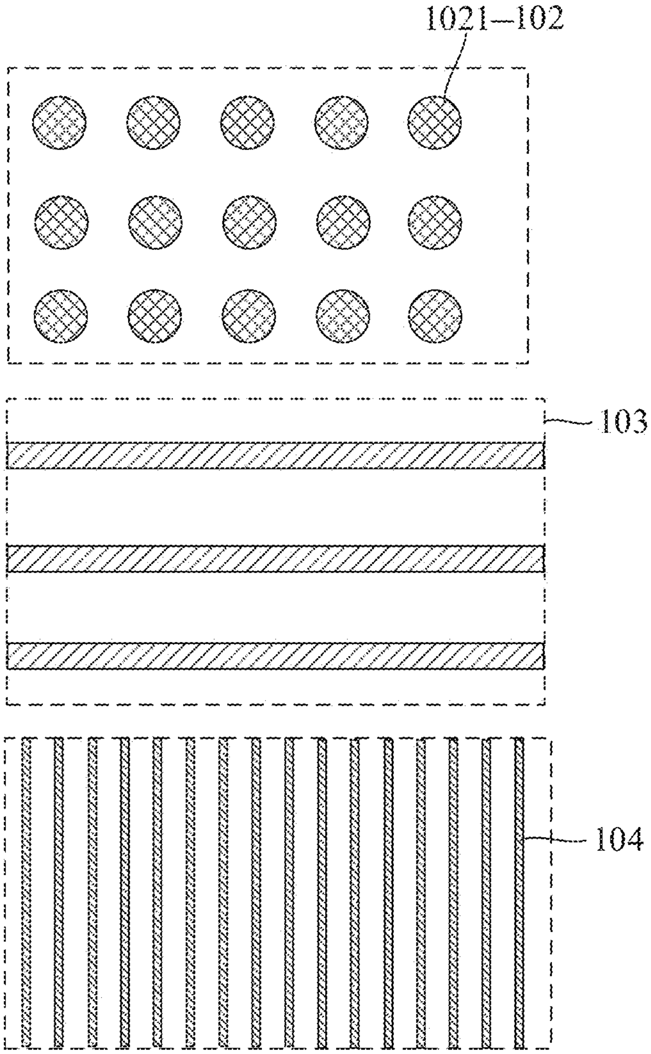
FIG. 3 is a schematic diagram of some film layers of the array substrate shown in FIG. 1.

FIG. 1 is a schematic structural diagram of an array substrate 100 according to some embodiments of the present disclosure, FIG. 2 is a schematic diagram of a cross-sectional structure along A1-A2 of the array substrate shown in FIG. 1, and FIG. 3 is a schematic diagram of some film layers of the array substrate shown in FIG. 1. Referring to FIG. 1, FIG. 2, and FIG. 3, the array substrate 100 includes a base 101, a light-reflective pattern 102, a plurality of first gate signal lines 103, and a plurality of data signal lines 104. FIG. 3 illustrates three film layers laminated in a direction going away from the base 101 in the array substrate 100, and the three film layers include the light-reflective pattern 102, the plurality of first gate signal lines (Gate1) 103, and the plurality of data signal lines (Data) 104.

The light-reflective pattern 102 is disposed on the base 101, and the light-reflective pattern 102 includes a plurality of reflective portions 1021. An opening region is defined between two adjacent reflective portions 1021, and the opening region is a light-transmissive region. The plurality of first gate signal lines 103 are disposed on the side of the light-reflective pattern 102 away from the base 101, and the plurality of data signal lines 104 are disposed on the side of the plurality of first gate signal lines 103 away from the base 101.

The orthographic projection of the first gate signal line 103 on the base 101 and the orthographic projection of the data signal line 104 on the base 101 have a first overlapping region c1, the first overlapping region c1 overlaps with the orthographic projection of the reflective portion 1021 on the base 101, and at least one of the plurality of first overlapping regions c1 is within the orthographic projection of the reflective portion 1021 on the base 101.

During use of the array substrate 100, a backlight source in the display panel is disposed on the side of the base 101 away from the light-reflective pattern 102. The first gate signal line 103 and the data signal line 104 are both film layers with low light transmittance, and the first gate signal line 103 and the data signal line 104 have an influence on the light transmittance of the display panel. Therefore, by providing the light-reflective pattern 102 on the side of the first gate signal line 103 and the data signal line 104 close to the base 101, the light-reflective pattern 102 overlaps at least partially with the first gate signal line 103 and the data signal line 104, and when light rays from a light source are irradiated to the light-reflective pattern 102, the light-reflective pattern 102 reflects the light rays from the light source to the other film layers (such as a backlight source). The other film layers reflect the light rays reflected by the light-reflective pattern 102, and the other film layers reflect at least part of the light rays from the light source towards the side of the light-reflective pattern 102 away from the base 101 through the opening region between adjacent reflective portions 1021. Thus, the backlight utilization rate of the display panel including the array substrate 100 can be improved by the light-reflective pattern 102, and the influence of the first gate signal line 103 and the data signal line 104 which have lower light transmittance on the light transmittance of the array substrate 100 can be reduced.

Furthermore, since the first overlapping region c1 is within the orthographic projection of the reflective portion 1021, the light transmittance of the first gate signal line 103 and the data signal line 104 that correspond to the first overlapping region c1 is lower than the light transmittance of the single-layer first gate signal line 103 and the light transmittance of the single-layer data signal line 104, which can further reduce the influence of the light-reflective pattern 102 on the light transmittance of the array substrate 100. Thus, the influence of the light-reflective pattern 102 on the aperture ratio of the display panel can be reduced.

In summary, the embodiments of the present disclosure provide an array substrate including a base, a light-reflective pattern, a plurality of first gate signal lines, and a plurality of data signal lines. The light-reflective pattern includes a plurality of reflective portions and an opening region is defined between two adjacent reflective portions. Since the first gate signal lines and the data signal lines are film layers having lower light transmittance, the light-reflective pattern overlaps at least partially with the first gate signal lines and the data signal lines, and when light rays from a light source are irradiated to the light-reflective pattern, the light-reflective pattern can reflect the light rays from the light source to the other film layers. The other film layers reflect at least part of the light rays from the light source towards the side of the light-reflective pattern away from the base. Thus, the backlight utilization rate of the display panel including the array substrate can be improved by the light-reflective pattern, and the influence of the first gate signal lines and the data signal lines which have lower light transmittance on the light transmittance of the array substrate can be reduced. In this way, the problem of a poor display effect of a display panel adopting the array substrate in some practices can be solved, and the display effect of the display panel can be improved.

Figure 4:
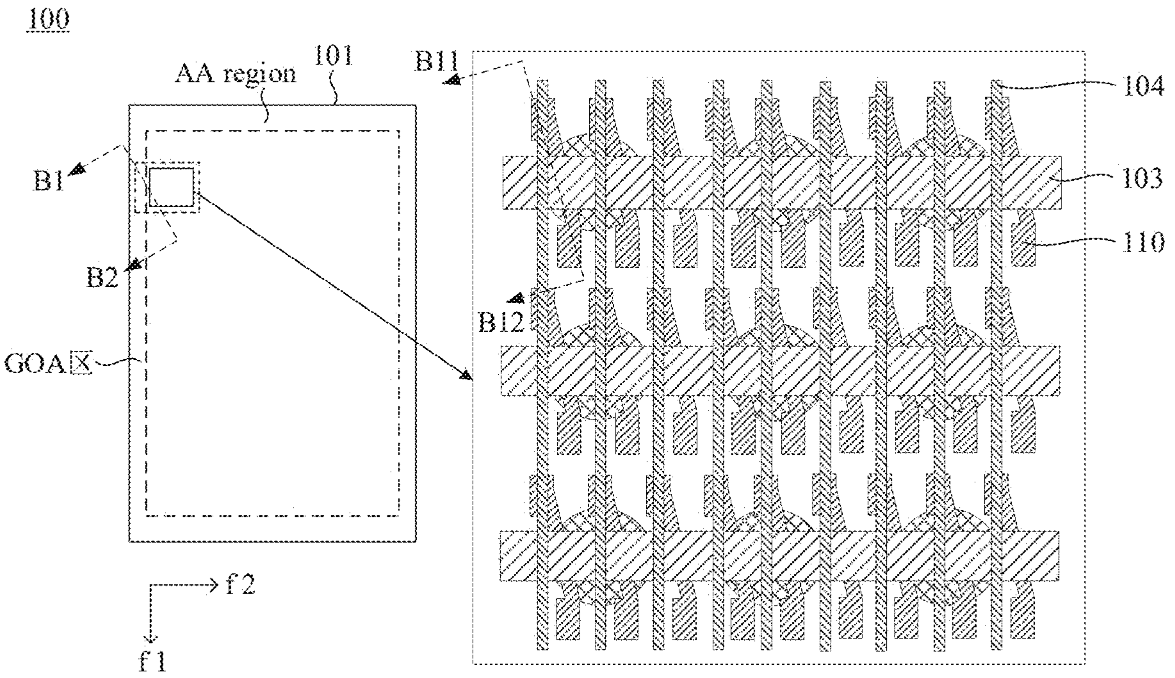
FIG. 4 is a schematic structural diagram of another array substrate according to some embodiments of the present disclosure.
Figure 5:
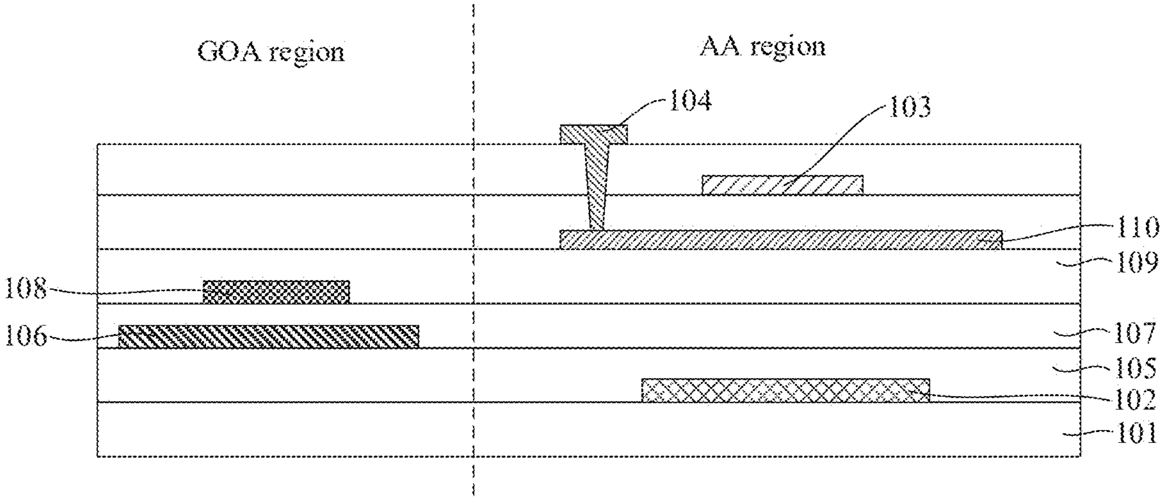
FIG. 5 is a schematic diagram of a cross-sectional structure along B1-B2 of the array substrate shown in FIG. 4.

FIG. 4 is a schematic structural diagram of another array substrate according to some embodiments of the present disclosure; and FIG. 5 is a schematic diagram of a cross-sectional structure along B1-B2 of the array substrate shown in FIG. 4. Referring to FIG. 4 and FIG. 5, in some embodiments, the array substrate 100 further includes a buffer layer 105, a second active layer pattern 106, a first gate insulating layer 107 (GI1), a plurality of second gate signal lines 108 (Gate2), a first interlayer dielectric layer 109 (ILD1) and a first active layer pattern 110 which are disposed between the plurality of first gate signal lines 103 and the light-reflective pattern 102. The buffer layer 105, the second active layer pattern 106, the first gate insulating layer 107, the plurality of second gate signal lines 108, the first interlayer dielectric layer 109, and the first active layer pattern 110 are laminated in the direction going away from the base 101.

The light-reflective pattern 102 is disposed at a position closer to the base 101, that is, the light-reflective pattern 102 is closer to the backlight source that is disposed on the other side of the base 101 away from the light-reflective pattern 102, which can further increase the light-reflecting efficiency of the light-reflective pattern 102.

The array substrate 100 includes a plurality of thin-film transistors, and the plurality of thin-film transistors include low temperature poly-silicon thin-film transistors (LTPS) and/or oxide thin-film transistors (O-TFT). The thin-film transistors are disposed on the base 101. The thin-film transistor includes an active layer, a source, and a drain. The source and the drain are disposed in the same layer, and are prepared by a single patterning process. It should be noted that in the embodiments of the present disclosure, the functions of the "source" and the "drain" are sometimes switched with each other in case where a thin-film transistor having opposite polarities is used or in case where the direction of current in a circuit changes. Therefore, in this specification, the "source" and "drain" are interchangeable, which is not limited in the embodiments of the present disclosure.

In the embodiments of the present disclosure, the array substrate 100 includes a display region and a non-display region. The display region and the non-display region are regions divided based on the layout of the display panel. The display region is referred to as an active region (AA) or a pixel circuit region, and the non-display region is a region on the array substrate 100 other than the display region, and the non-display region surrounds the display region. FIG. 4 illustrates the division of the display region and the non-display region on the array substrate 100 in the embodiments of the present disclosure. The non-display region includes regions such as a flexible circuit board pad region, and a gate driven on array (GOA) region. The GOA region includes two sub-partitions, and the two sub-partitions are on two sides of the display region, respectively.

It should be noted that the enlarged schematic structural diagram of the local film layers in the array substrate 100 shown in FIG. 4 is merely an enlarged schematic structural diagram of the local film layers in the display region, and the enlarged schematic structural diagram of the film layers in the non-display region is not shown. Moreover, the AA region in the cross-sectional structural diagram shown in FIG. 5 corresponds to the cross-sectional structural diagram at B11-B12 shown in the enlarged schematic structural diagram of the local film layers in FIG. 4, and the overlapping position of the first gate signal line 103 and the data signal line 104 is not shown in FIG. 5 in order to show more clearly the positional relationship between the film layers of the plurality of structures in the array substrate 100.

The thin-film transistor in the display region is an oxide thin-film transistor due to the high requirement for uniformity of the characteristics of the thin-film transistor in the display region, and the thin-film transistor in the GOA region is a LTPS thin-film transistor due to the high requirement for high mobility of the thin-film transistor in the GOA region.

The second active layer pattern 106 in FIG. 5 includes a plurality of second active layers. The second active layer is a LTPS layer, and the second active layers serves as an active layer of the LTPS thin-film transistor disposed in the GOA region. The first active layer pattern 110 includes a plurality of first active layers. The first active layer is a metal oxide semiconductor layer, and the first active layer serves as an active layer of the oxide thin-film transistor disposed in the display region. The material of the metal oxide semiconductor layer includes indium-zinc oxide (IZO), indium-gallium oxide (IGO), indium-gallium-zinc oxide (IGZO), indium-gallium-tin oxide (IGTO), indium-tin-zinc oxide (ITZO), or a unit metal or multi metal oxide consisting of indium (In), gallium (Ga), zinc (Zn), tin (Sn), aluminum (Al), tungsten (W), zirconium (Zr), hafnium (Hf), and silicon (Si).

In some embodiments, a buffer layer 105 is provided between the light-reflective pattern 102 and the second active layer pattern 106. The buffer layer 105 includes at least one of an inorganic insulating layer and an organic insulating layer. For example, the buffer layer 105 is a composite film layer including an inorganic insulating layer and an organic insulating layer, and the organic insulating layer is disposed on the side of the inorganic insulating layer away from the base 101, so that the buffer layer 105 can protect the light-reflective pattern 102 by means of the inorganic insulating layer to prevent the light-reflective pattern 102 from being damaged due to corrosion caused by external moisture. The buffer layer 105 can also improve the flatness of the second active layer pattern 106 disposed on the side of the buffer layer 105 away from the base 101 by means of the organic insulating layer, to improve the film layer quality of the second active layer pattern 106.

In an optional implementation, the material of the light-reflective pattern 102 includes at least one of molybdenum (Mo), aluminum, titanium (Ti), and argentum (Ag), and the thickness of the light-reflective pattern 102 is in the range of 50 angstroms to 2000 angstroms. For example, the material of the light-reflective pattern 102 is argentum, which can make the light-reflecting efficiency of the light-reflective pattern 102 better. Alternatively, the material of the light-reflective pattern 102 includes an aluminum alloy. Since the aluminum alloy material has a better light-reflecting effect while having a better film layer quality, the light-reflective pattern 102 is provided as a single-layer structure to simplify the manufacturing process of the light-reflective pattern 102.

Figure 6:
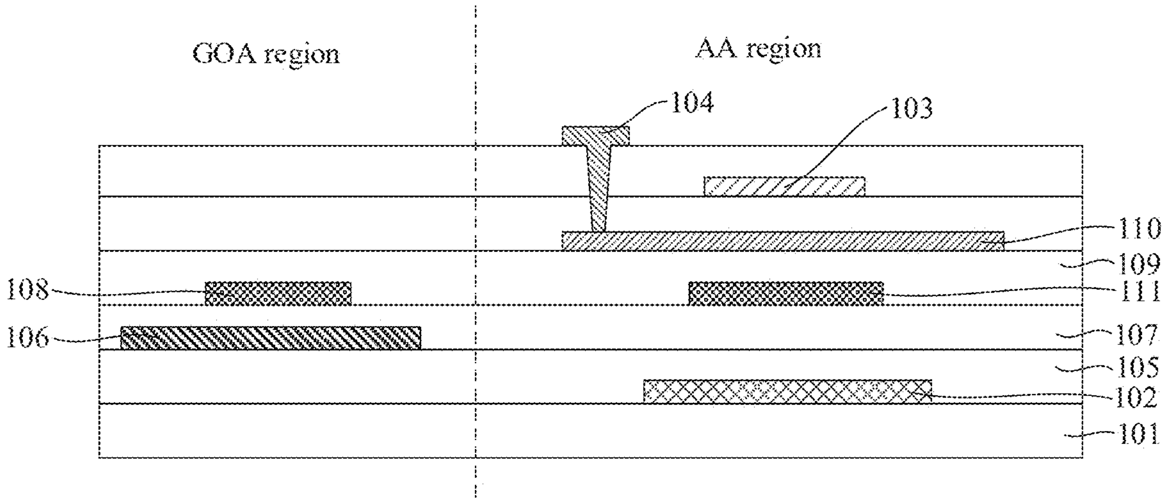
FIG. 6 is a schematic diagram of another cross-sectional structure along B1-B2 of the array substrate shown in FIG. 4.

FIG. 6 is a schematic diagram of another cross-sectional structure along B1-B2 of the array substrate 100 shown in FIG. 4. Referring to FIG. 6, in an optional implementation, the array substrate 100 further includes a light-shielding pattern 111 disposed between the light-reflective pattern 102 and the first active layer pattern 110. The first active layer pattern 110 includes a plurality of first active layers. The first active layer has a channel region, and the orthographic projection of the channel region on the base 101 is within the orthographic projection of the light-shielding pattern 111 on the base 101. The orthographic projection of the light-shielding pattern 111 on the base 101 overlaps with the orthographic projection of the light-reflective pattern 102 on the base 101.

The light-shielding pattern 111 is disposed on the side of the first active layer close to the base 101, and the orthographic projection of the light-shielding pattern 111 on the base 101 overlaps with the orthographic projection of the first active layer on the base 101. The light-shielding pattern 111 is configured to block light rays (e.g., light rays emitted from the backlight source on the display panel) from being incident on the first active layer, so as to avoid the light rays from affecting the stability of the channel region of the first active layer; and the light-shielding pattern 111 is further configured to prevent the film layer disposed on the side of the light-shielding pattern 111 away from the first active layer from affecting the electrical properties of the first active layer under the effect of an electric field.

In some embodiments, the light-shielding pattern 111 is in the same layer as the second gate signal line 108, and a second gate insulating layer 118 is provided between the light-shielding pattern 111 and the first active layer. The second gate insulating layer 118 includes at least one of an inorganic insulating layer and an organic insulating layer. For example, the second gate insulating layer 118 is a composite film layer including an inorganic insulating layer and an organic insulating layer, and the organic insulating layer is disposed on the side of the inorganic insulating layer away from the base 101, so that the second gate insulating layer 118 can protect the light-shielding pattern 111 by means of the inorganic insulating layer to prevent the light-shielding pattern 111 from being damaged due to corrosion caused by external moisture. The second gate insulating layer 118 can also improve the flatness of the first active layer disposed on the side of the first gate insulating layer 107 away from the base 101 by means of the organic insulating layer, to improve the film layer quality of the first active layer.

Figure 7:
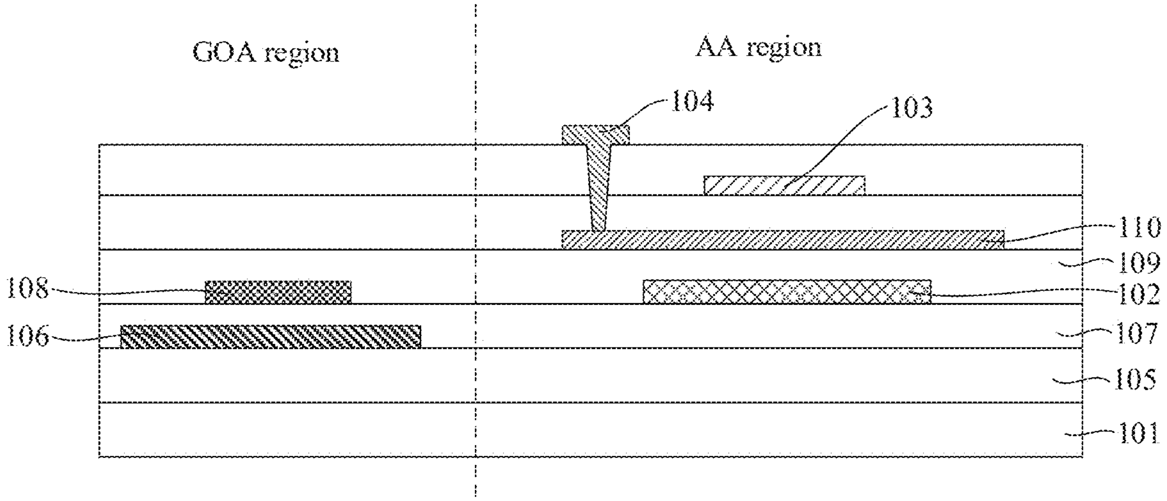
FIG. 7 is a schematic diagram of still another cross-sectional structure along B1-B2 of the array substrate shown in FIG. 4.

FIG. 7 is a schematic diagram of still another cross-sectional structure along B1-B2 of the array substrate 100 shown in FIG. 4. Referring to FIG. 7, in an optional implementation, the array substrate 100 further includes a buffer layer 105, a second active layer pattern 106, a first gate insulating layer 107, a plurality of second gate signal lines 108, a first interlayer dielectric layer 109, and a first active layer pattern 110 that are disposed on the side of the plurality of first gate signal lines 103 close to the base 101. The buffer layer 105, the second active layer pattern 106, the first gate insulating layer 107, the plurality of second gate signal lines 108, the first interlayer dielectric layer 109, and the first active layer pattern 110 are laminated in the direction going away from the base 101. The light-reflective pattern 102 is in the same layer as the plurality of second gate signal lines 108. In this way, the second gate signal lines 108 and the light-reflective pattern 102 can be formed by a single patterning process, which can simplify the manufacturing process of the array substrate 100.

In some embodiments, the material of the light-reflective pattern 102 includes at least one of molybdenum, aluminum, and titanium, and the thickness of the light-reflective pattern 102 is in the range of 1500 angstroms to 6000 angstroms. The thickness of the light-reflective pattern 102 is equal to as the thickness of the second gate signal line 108. In this case, the light-reflective pattern 102 is manufactured at a temperature of 25° C. to 300° C.

Referring to FIG. 1, in an optional implementation, the plurality of reflective portions 1021 are arranged in an array; the data signal line 104 extends along a first direction f1, and the plurality of data signal lines 104 are arranged along a second direction f2; the first gate signal line 103 extends along the second direction f2, and the plurality of first gate signal lines 103 are arranged along the first direction f1.

The plurality of reflective portions 1021 satisfy the following formula:

$$L_1 = n \times H;$$

$$L_2 = 3n \times W;$$

wherein $L_1$ represents the distance between the centers of two reflective portions 1021 adjacent in the first direction f1, H represents the shortest distance between the centers of two adjacent first gate signal lines 103 in the first direction f1, and n is a positive integer greater than or equal to 1. $L_2$ represents the distance between the centers of two reflective portions 1021 adjacent in the second direction f2, and W represents the shortest distance between the centers of two adjacent data signal lines 104 in the second direction f2.

The plurality of first overlapping regions c1 are arranged in rows and columns. When n is 1, in the second direction f2, the arrangement density of the first overlapping regions c1 is three times the arrangement density of the reflective portions 1021, that is, in the second direction f2, every three first overlapping regions c1 correspond to one reflective portion 1021. The third first overlapping region c1, the sixth overlapping region c1, the ninth overlapping region c1 and the like of the plurality of first overlapping regions c1 in one row are within the orthographic projections of the corresponding reflective portions 1021 on the base 101.

In the first direction f1, the arrangement density of the first overlapping regions c1 is the same as the arrangement density of the reflective portions 1021, that is, in the first direction f1, the plurality of first overlapping regions c1 are in one-to-one correspondence with the plurality of reflective portions 1021.

If the plurality of reflective portions 1021 in the light-reflective pattern are arranged too densely, the opening region between two adjacent reflective portions 1021 will be smaller, and it will be difficult for the light rays emitted from the backlight source and the light rays reflected by the reflective portions 1021 to be emitted out through the opening region to the sides of the reflective portions 1021 away from the base 101, thereby resulting in low light transmittance of the array substrate 100. In the embodiments of the present disclosure, by arranging the plurality of reflective portions 1021 in accordance with the above-described formula, the plurality of reflective portions 1021 in the light-reflective pattern are prevented from being arranged two densely, thereby improving the light transmittance of the array substrate 100.

Figure 8:
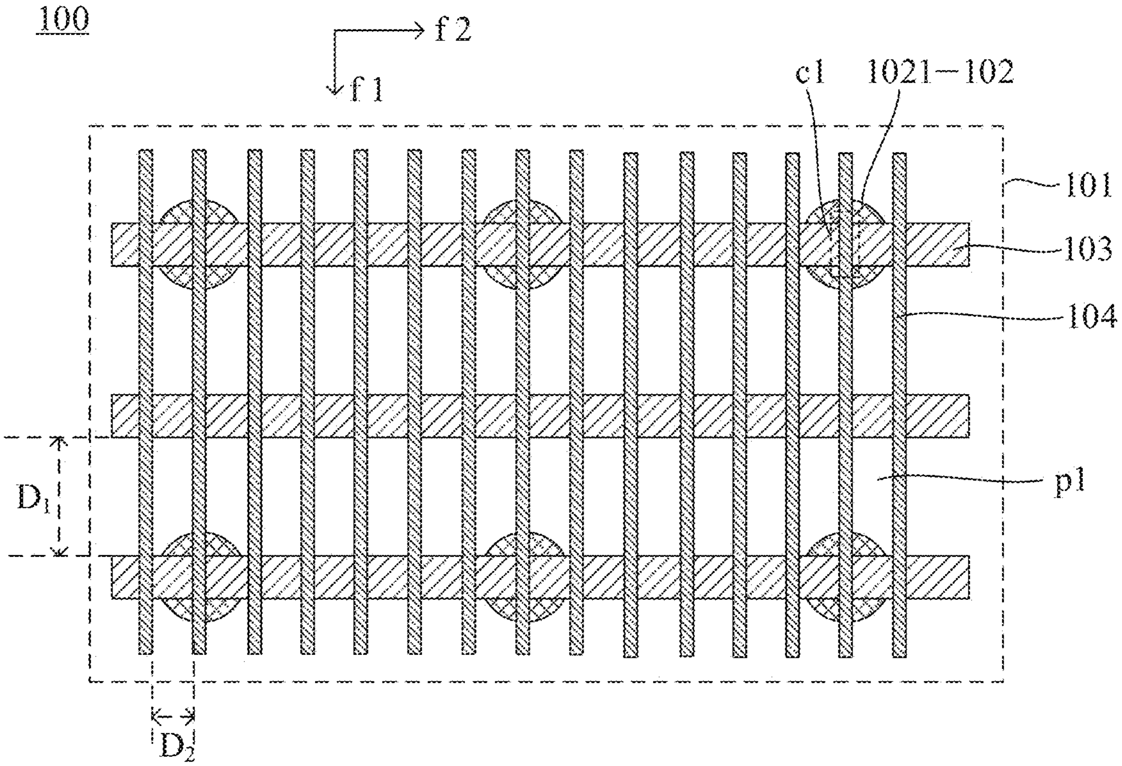
FIG. 8 is a schematic structural diagram of still another array substrate according to some embodiments of the present disclosure.

FIG. 8 is a schematic structural diagram of still another array substrate 100 according to some embodiments of the present disclosure. Referring to FIG. 8, in an exemplary implementation, the above-described n has a value range of 2 to 5. As shown in FIG. 8, n is 2, and when n is 2, the size of the opening region between two adjacent reflective portions 1021 can be enlarged, which can facilitate the light rays emitted from the backlight source and the light rays reflected by the reflective portions 1021 being emitted out through the opening region.

Referring to FIG. 8, in some embodiments, the plurality of first gate signal lines 103 and the plurality of data signal lines 104 satisfy the following formula:

$$D_1/D_2 \geqslant 1.3;$$

wherein $D_1$ represents the distance between two adjacent first gate signal lines 103, and $D_2$ represents the distance between two adjacent data signal lines 104. The extension direction of the first gate signal line 103 is perpendicular to the extension direction of the data signal line 104. In this way, two adjacent first gate signal lines 103 and two adjacent data signal lines 104 enclose a pixel region p1, and a pixel electrode 112 is distributed in the pixel region p1. The pixel region p1 in the array substrate 100 of FIG. 8 is rectangular in shape, and for example, the ratio of the long side to the short side of the pixel region p1 is 3.

Figure 9:
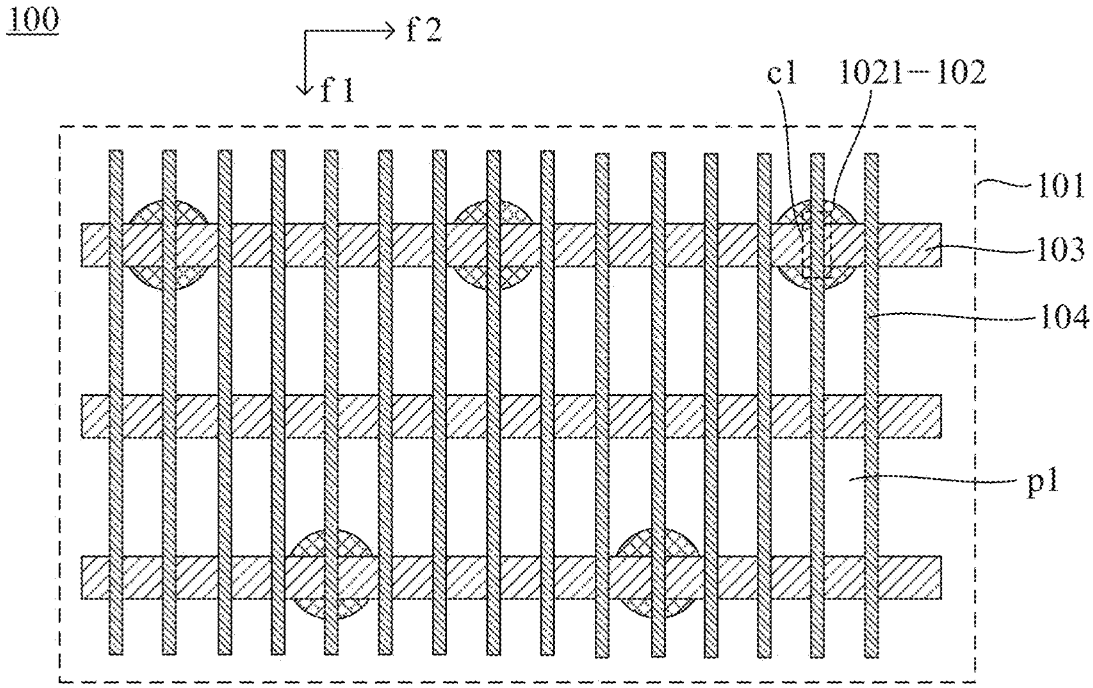
FIG. 9 is a schematic structural diagram of still another array substrate according to some embodiments of the present disclosure.

FIG. 9 is a schematic structural diagram of still another array substrate 100 according to some embodiments of the present disclosure. Referring to FIG. 9, in an optional implementation, the plurality of reflective portions 1021 are arranged in a plurality of rows, the plurality of rows of reflective portions 1021 are arranged along the first direction f1, and the plurality of reflective portions 1021 in one row of reflective portions 1021 are arranged along the second direction f2. The first direction f1 is the extension direction of the data signal line 104, and the second direction f2 is the extension direction of the first gate signal line 103. The plurality of reflective portions 1021 in two adjacent rows of reflective portions 1021 are arranged in a staggered manner. Since the light transmitting effect at the positions of the reflective portions 1021 is poorer than the light transmitting effect at the opening regions, by arranging two adjacent rows of reflective portions 1021 in a staggered manner, it is prevented that the light effect at the position of a certain column of reflective portions 1021 is poorer, thereby preventing bright and dark stripes from occurring on the display panel, that is, reducing the display defects caused by a large difference in light transmittance in the regions corresponding to two adjacent columns of reflective portions 1021, and increasing the uniformity degree of the light effect of the display panel.

Figure 10:
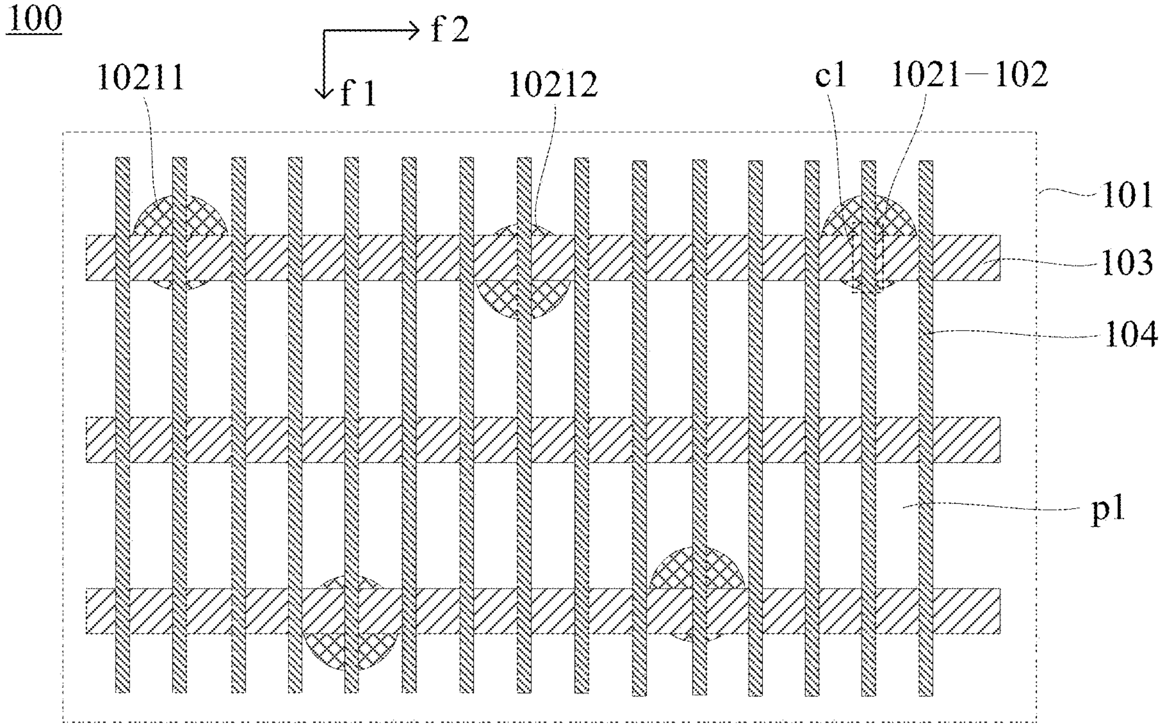
FIG. 10 is a schematic structural diagram of still another array substrate according to some embodiments of the present disclosure.

FIG. 10 is a schematic structural diagram of still another array substrate 100 according to some embodiments of the present disclosure. Referring to FIG. 10, in an optional implementation, the plurality of reflective portions 1021 are arranged in a plurality of rows, the plurality of rows of reflective portions 1021 are arranged along the first direction f1, and the plurality of reflective portions 1021 in one row of reflective portions 1021 are arranged along the second direction f2. The first direction f1 is the extension direction of the data signal line 104, and the second direction f2 is the extension direction of the first gate signal line 103. One row of reflective portions 1021 include a plurality of first reflective portions 10211 and a plurality of second reflective portions 10212, and the first reflective portions 10211 and the second reflective portions 10212 are arranged alternately along the second direction f2. The first overlapping region c1 has a first side and a second side opposite to each other in the first direction f1, the center of the orthographic projection of the first reflective portion 10211 on the base 101 is at the first side of the center of the first overlapping region c1, and the center of the orthographic projection of the second reflective portion 10212 on the base 101 is at the second side of the center of the first overlapping region c1.

In this way, the uniformity degree of light rays transmitting through the opening regions on two sides of one row of reflective portions 1021 can be improved, and the influence of the reflective portions 1021 arranged in a plurality of rows on the light transmittance of the display panel at the position of one row of reflective portions 1021 can be reduced, thereby improving the uniformity degree of the light effect of the display panel.

In some embodiments, in the first direction f1, the distance between the centers of adjacent first reflective portion 10211 and second reflective portion 10212 ranges from 1 μm to 5 μm, which can prevent the reflective portions 1021 from being staggered with the first overlapping region c1, thereby reducing the influence of the reflective portions 1021 on the light transmittance of the array substrate 100.

Figure 11:
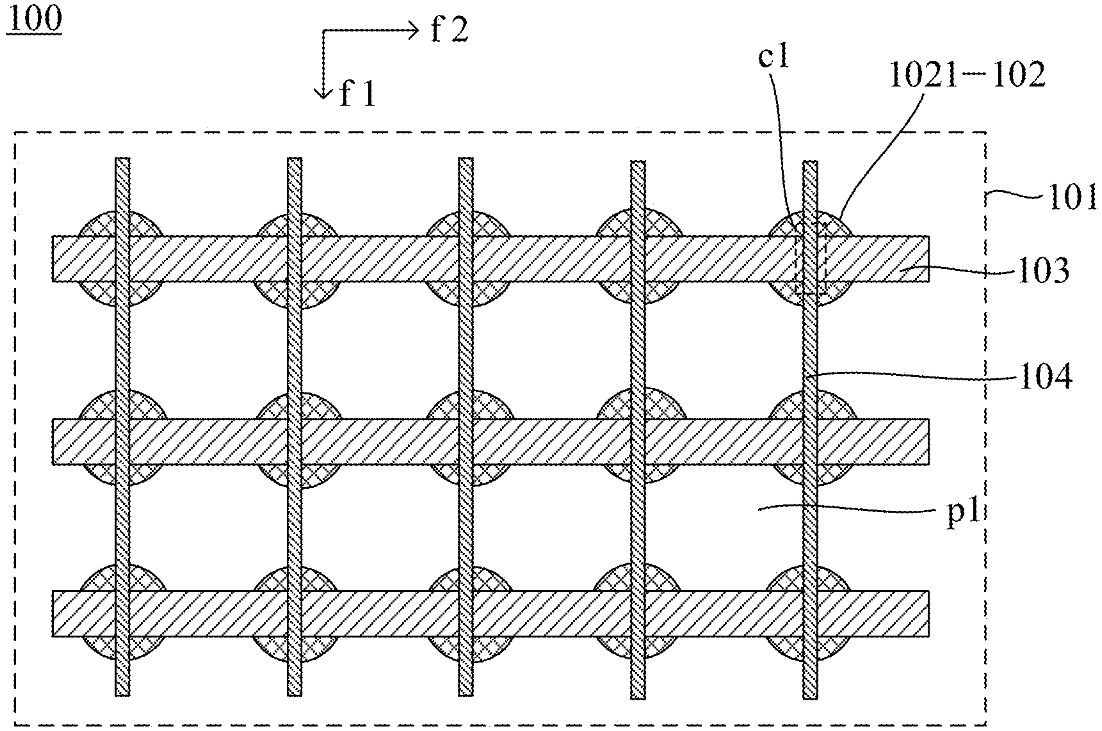
FIG. 11 is a schematic structural diagram of still another array substrate according to some embodiments of the present disclosure.

FIG. 11 is a schematic structural diagram of still another array substrate 100 according to some embodiments of the present disclosure. Referring to FIG. 11, in an optional implementation, when the ratio of the long side to the short side of the pixel region p1 is less than 1.3, the plurality of reflective portions 1021 are in one-to-one correspondence with the plurality of first overlapping regions c1. For example, in the case that the ratio of the long side to the short side of the pixel region p1 is 1, i.e., the shape of the pixel region p1 is square, the plurality of reflective portions 1021 are in one-to-one correspondence with the plurality of first overlapping regions c1 in the array substrate 100.

Figure 12:
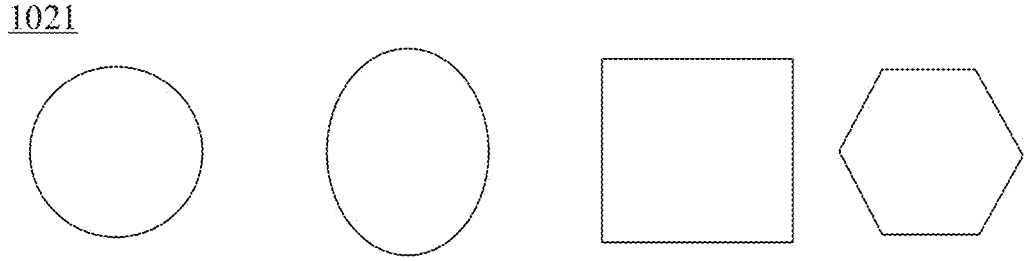
FIG. 12 is a schematic diagram showing shapes of a plurality of types of reflective portions according to some embodiments of the present disclosure.

FIG. 12 is a schematic diagram showing shapes of a plurality of types of reflective portions according to some embodiments of the present disclosure. Referring to FIG. 12, in an optional implementation, the shape of the orthographic projection of the reflective portion 1021 on the base 101 include at least one of a circle, an ellipse, a square, and a square hexagon. When the shape of the orthographic projection of the reflective portion 1021 on the base 101 is an ellipse, the ratio of the length of the major axis to the length of the minor axis of the ellipse is less than 3.

In some embodiments, referring to FIG. 11, the difference value between the width of the reflective portion 1021 in the first direction f1 and the width of the first overlapping region c1 in the first direction f1 ranges from 2 μm to 20 μm, and the difference value between the width of the reflective portion 1021 in the second direction f2 and the width of the first overlapping region c1 in the second direction f2 ranges from 2 μm to 10 μm. Moreover, the center of the orthographic projection of the reflective portion 1021 on the base 101 coincides with the center of the first overlapping region c1 that is in the orthographic projection of the reflective portion 1021 on the base 101.

Figure 13:
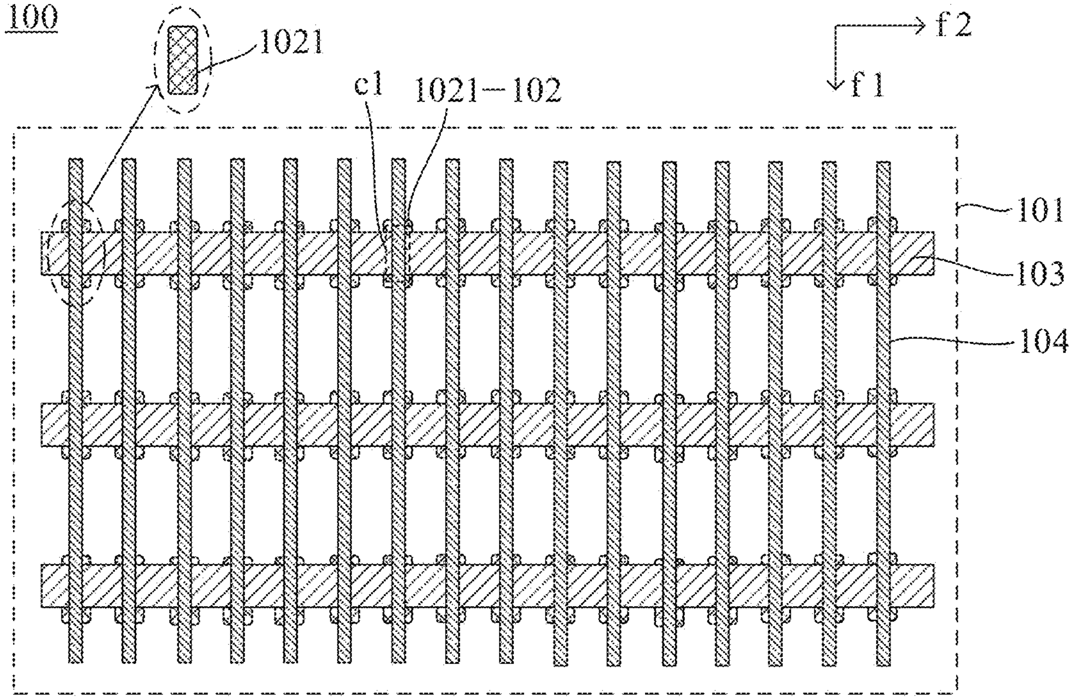
FIG. 13 is a schematic structural diagram of still another array substrate according to some embodiments of the present disclosure.

FIG. 13 is a schematic structural diagram of still another array substrate 100 according to some embodiments of the present disclosure. Referring to FIG. 13, in an optional implementation, the orthographic projection of the reflective portion 1021 on the base 101 is rectangular, the plurality of reflective portions 1021 are in one-to-one correspondence with the plurality of first overlapping regions c1, and the first overlapping region c1 is in the orthographic projection of the corresponding reflective portion 1021 on the base 101. The difference value between the width of the reflective portion 1021 in the first direction f1 and the width of the first overlapping region c1 in the first direction f1 ranges from 1 μm to 8 μm, and the difference value between the width of the reflective portion 1021 in the second direction f2 and the width of the first overlapping region c1 in the second direction f2 ranges from 1 μm to 6 μm. Moreover, the center of the orthographic projection of the reflective portion 1021 on the base 101 coincides with the center of the first overlapping region c1 that is in the orthographic projection of the reflective portion 1021 on the base 101.

In the case that the orthographic projection of the reflective portion 1021 on the base 101 is rectangular, the shape of the reflective portion 1021 is very similar to the shape of the first overlapping region c1, and the difference between the size of the reflective portion 1021 and the size of the first overlapping region c1 is smaller. Therefore, the influence of the reflective portion 1021 on the light transmittance of the array substrate 100 can be reduced. By arranging the plurality of reflective portions 1021 to be in one-to-one correspondence with the plurality of first overlapping regions c1, the light-reflecting area of the light-reflective pattern 102 including the plurality of reflective portions 1021 can be increased under the premise that the influence of the reflective portions 1021 on the light transmittance of the array substrate 100 is lower, thereby increasing the light-reflecting efficiency of the light-reflective pattern 102.

Figure 14:
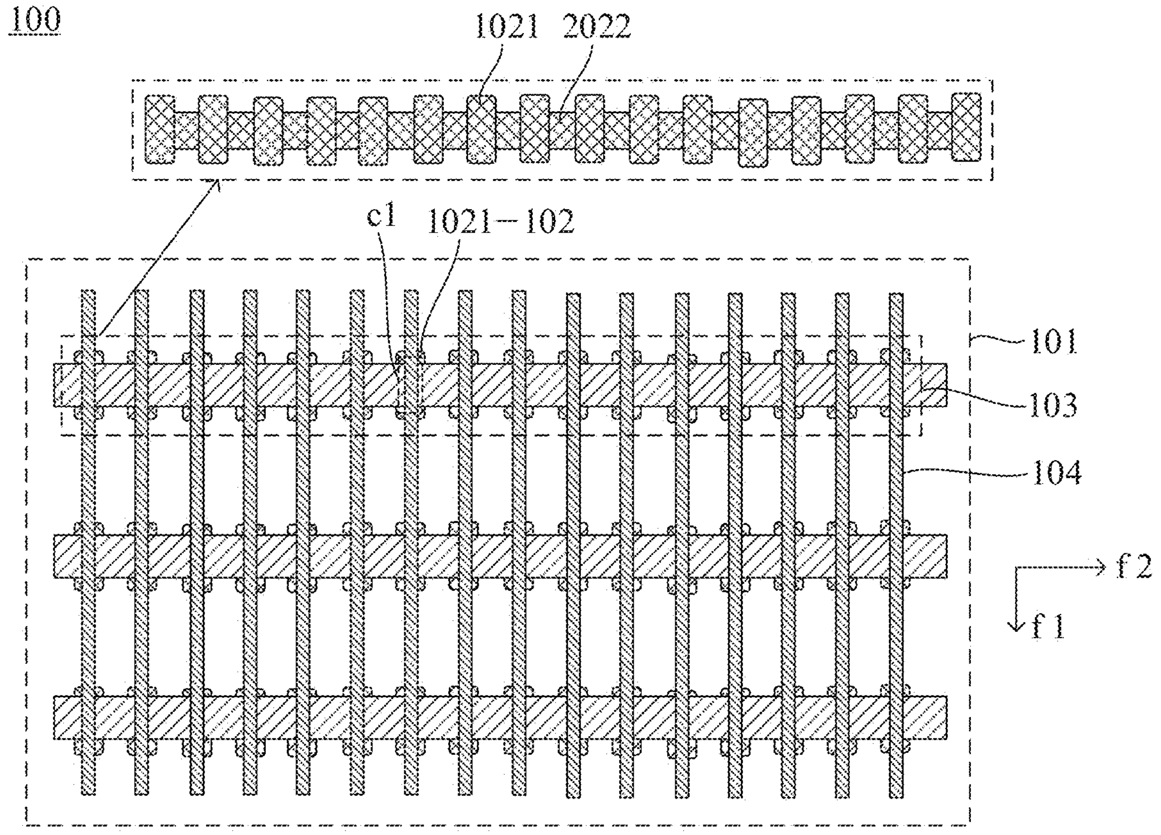
FIG. 14 is a schematic structural diagram of still another array substrate according to some embodiments of the present disclosure.

FIG. 14 is a schematic structural diagram of still another array substrate 100 according to some embodiments of the present disclosure. Referring to FIG. 14, in an optional implementation, the plurality of reflective portions 1021 are arranged in a plurality of rows, the plurality of rows of reflective portions 1021 are arranged along the first direction f1, and the plurality of reflective portions 1021 in one row of reflective portions 1021 are arranged along the second direction f2. The light-reflective pattern 102 also includes a plurality of connection portions 1022, the connection portion 1022 is disposed between two adjacent reflective portions 1021 in one row of reflective portions 1021 and is connected to the two adjacent reflective portions 1021. The orthographic projection of the connection portion 1022 on the base is within the orthographic projection of the first gate signal line 103 on the base.

Two adjacent reflective portions 1021 are respectively disposed on two sides of the connection portion 1022, and one ends of the two reflective portions 1021 are respectively connected to two sides of the connection portion 1022. The reflective portion 1021 and the connection portion 1022 are disposed in the same layer and are manufactured by a single patterning process. The plurality of the reflective portions 1021 in one row of reflective portions 1021 are arranged along the second direction f2, and two adjacent connection portions 1022 are disposed on two sides of the reflective portion 1021 in the second direction f2. Since a film layer (e.g., the first gate signal line 103) with lower light transmittance is provided on the side of the connection portions 1022 away from the base 101, and the first gate signal line 103 overlaps with the reflective portion 1021, by providing the reflective portions 1021 and the connection portions 1022 connecting the reflective portions 1021 in the light-reflective pattern 102, the light-reflecting area of the light-reflective pattern 102 can be increased on the premise that the light-reflective pattern 102 does not influence the light transmittance of the array substrate 100, thereby increasing the backlight utilization rate of the display panel, and increasing the aperture ratio of the display panel.

Figure 15:
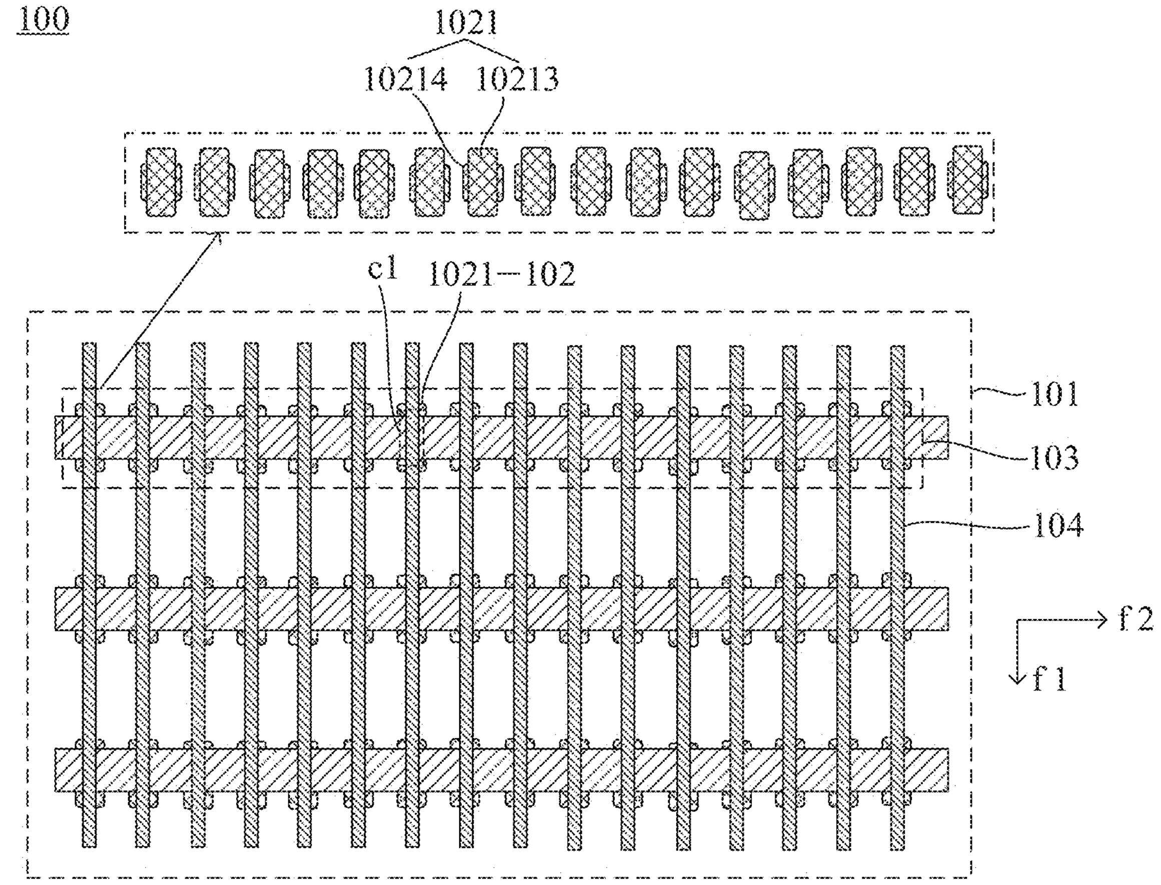
FIG. 15 is a schematic structural diagram of still another array substrate according to some embodiments of the present disclosure.

FIG. 15 is a schematic structural diagram of still another array substrate 100 according to some embodiments of the present disclosure. Referring to FIG. 15, in an optional implementation, the reflective portion 1021 includes a reflective portion body 10213 and two first protruding structures 10214. The two first protruding structures 10214 are respectively disposed on two sides of the reflective portion body 10213 in the second direction f2, and an opening region is defined between the first protruding structures 10214 of two reflective portions 1021 adjacent in the second direction f2. The orthographic projection of the first protruding structure 10214 on the base is within the orthographic projection of the first gate signal line 103 on the base. The reflective portion body 10213 and the first protruding structures 10214 are disposed in the same layer and are manufactured by a single patterning process.

The first protruding structures 10214 disposed on two sides of the reflective portion body 10213 are used to increase the light-reflecting area of the reflective portion 1021. Since a film layer with lower light transmittance (e.g., the first gate signal line 103) is provided on the side, away from the base 101, the reflective portion body 10213 and the first protruding structures 10214, and the first gate signal line 103 overlaps with the reflective portion body 10213 and the first protruding structures 10214, by providing the reflective portion body 10213 and the first protruding structures 10214 in the reflective portion 1021, the light-reflecting area of the reflective portion 1021 can be increased on the premise that the reflective portion 1021 does not influence the light transmittance of the array substrate 100, thereby increasing the backlight utilization rate of the display panel and increasing the aperture ratio of the display panel. Moreover, an opening region is defined between the first protruding structures 10214 of two reflective portions 1021 adjacent in the second direction f2, which can increase the light transmitting area between the adjacent reflective portions 1021, thereby reducing the influence of the reflective portions 1021 on the light transmittance of the array substrate 100.

Figure 16:
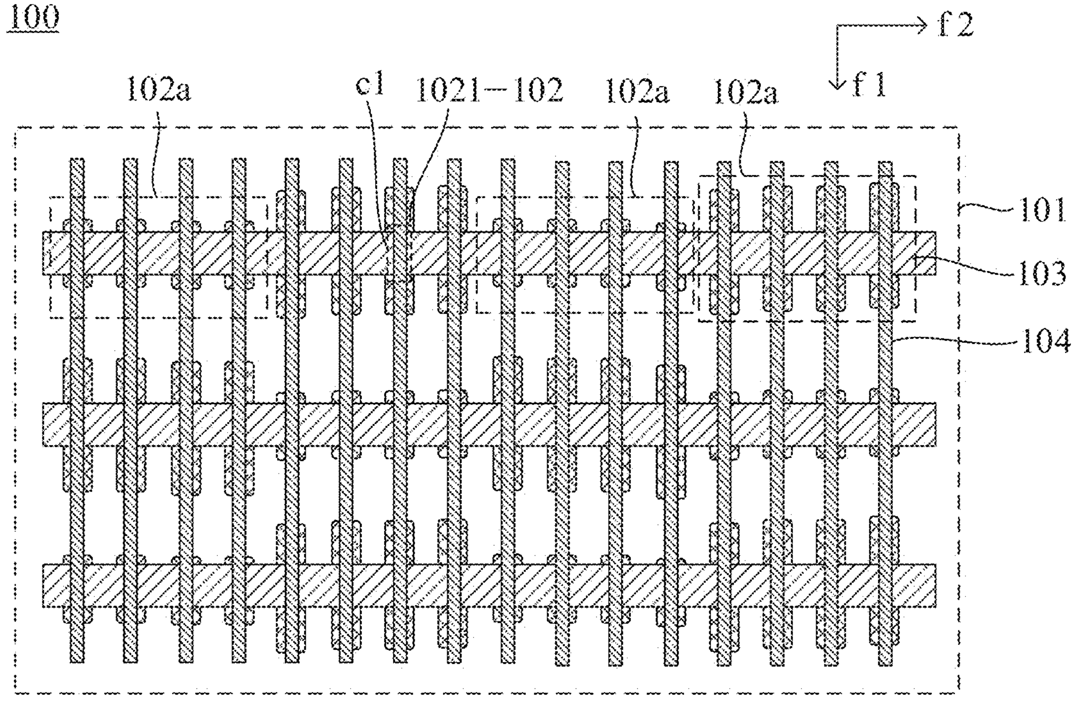
FIG. 16 is a schematic structural diagram of still another array substrate according to some embodiments of the present disclosure.

FIG. 16 is a schematic structural diagram of still another array substrate 100 according to some embodiments of the present disclosure. Referring to FIG. 16, in an optional implementation, the plurality of reflective portions 1021 are arranged in a plurality of rows, the plurality of rows of reflective portions 1021 are arranged along the first direction f1, and the plurality of reflective portions 1021 in one row of reflective portions 1021 are arranged along the second direction f2. One row of reflective portions 1021 include a plurality of reflective portion units **102*a*, and one reflective portion unit 102*a* includes a plurality of reflective portions 1021. In two adjacent reflective portion units 102*a*, the reflective portions 1021 in one reflective portion unit 102*a* have a first length in the first direction f1, and the reflective portions 1021 in the other reflective portion unit 102*a* have a second length in the first direction f1**, and the first length is greater than the second length.

Since the light transmitting effect at the position of the reflective portion 1021 is poorer than the light transmitting effect at the opening region, by setting the reflective portions 1021 in two adjacent reflective portion units **102*a* to have different lengths, the opening regions on two sides of the reflective portions 1021 in the two reflective portion units 102*a* have different sizes, which can improve the obvious abnormal display on the display panel (e.g., the appearance of bright and dark stripes) caused by the same length of the plurality of the reflective portions 1021 in one row of reflective portions 1021, reduce the influence of the reflective portions 1021 on the display effect of the display panel, and improve the uniformity of the light effect of the display panel. In some embodiments, one reflective portion unit 102*a* includes four reflective portions 1021, or one reflective portion unit 102*a* includes three reflective portions 1021, five reflective portions 1021, or more reflective portions 1021**, which is not limited in the embodiments of the present disclosure.

Figure 17:
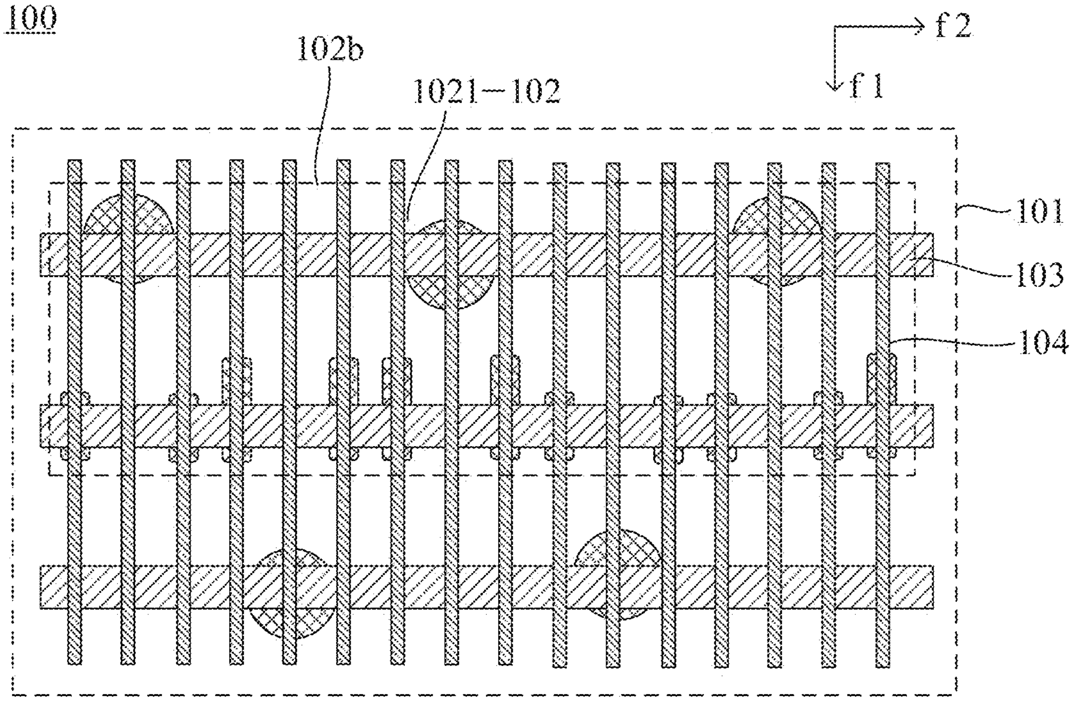
FIG. 17 is a schematic structural diagram of still another array substrate according to some embodiments of the present disclosure.
Figure 18:
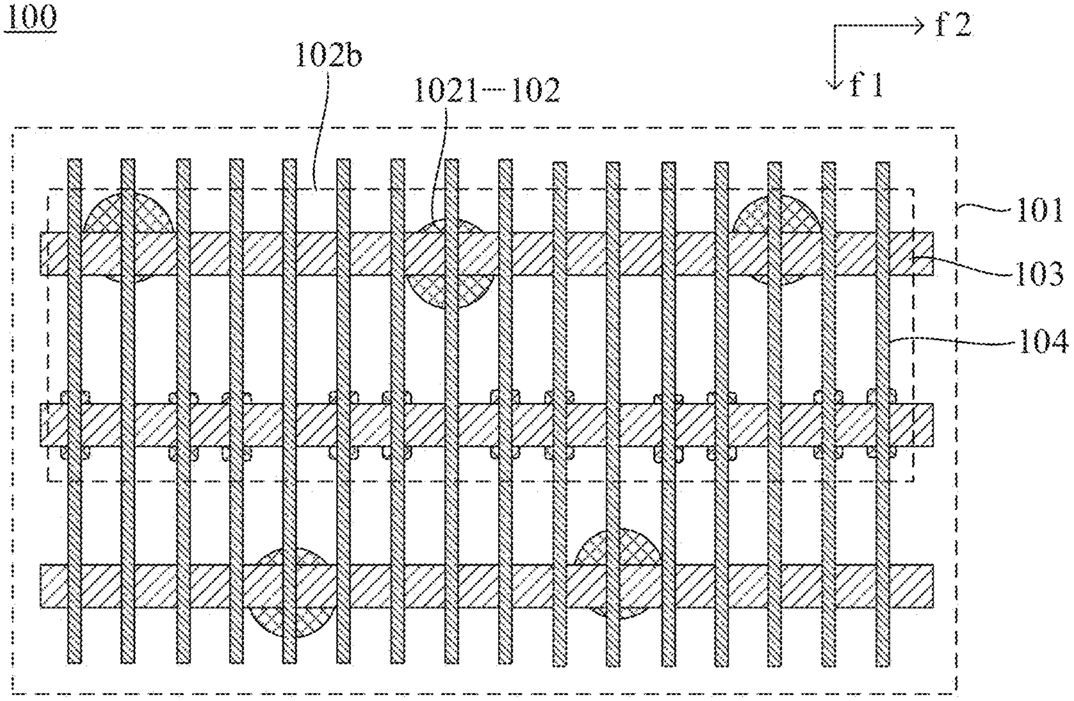
FIG. 18 is a schematic structural diagram of still another array substrate according to some embodiments of the present disclosure.

FIG. 17 is a schematic structural diagram of still another array substrate 100 according to some embodiments of the present disclosure, and FIG. 18 is a schematic structural diagram of still another array substrate 100 according to some embodiments of the present disclosure. Referring to FIG. 17 and FIG. 18, in an optional implementation, the plurality of reflective portions 1021 include a plurality of reflective portion groups 102*b*, one reflective portion group 102*b* includes two rows of reflective portions 1021, and the plurality of reflective portion groups 102*b* are arranged along the first direction f1. The two rows of reflective portions 1021 in one reflective portion group 102*b* are arranged along the first direction f1, and the plurality of reflective portions 1021 in one row of reflective portions 1021 are arranged along the second direction f2. The first direction f1 is an extension direction of the data signal line 104, and the second direction f2 is an extension direction of the first gate signal line 103. In one reflective portion group 102*b*, the orthographic projections of the plurality of reflective portions 1021 in one row of reflective portions 1021 on the base 101 are circular in shape, and the orthographic projections of the plurality of reflective portions 1021 in the other row of reflective portions 1021 on the base 101 are rectangular in shape.

Since the light transmitting effect at the position of the reflective portion 1021 is poorer than the light transmitting effect at the opening region, by setting two adjacent rows of reflective portions 1021 in one reflective portion group 102*b* to have different shapes, the arrangement regularity of the plurality of reflective portions 1021 in the light-reflective pattern 102 can be reduced, and the uniformity of the light effect of the display panel can be improved.

In some embodiments, the display panel adopting the array substrate 100 provided in the embodiments of the present disclosure has an aperture ratio in the range of 20% to 45%.

Figure 19:
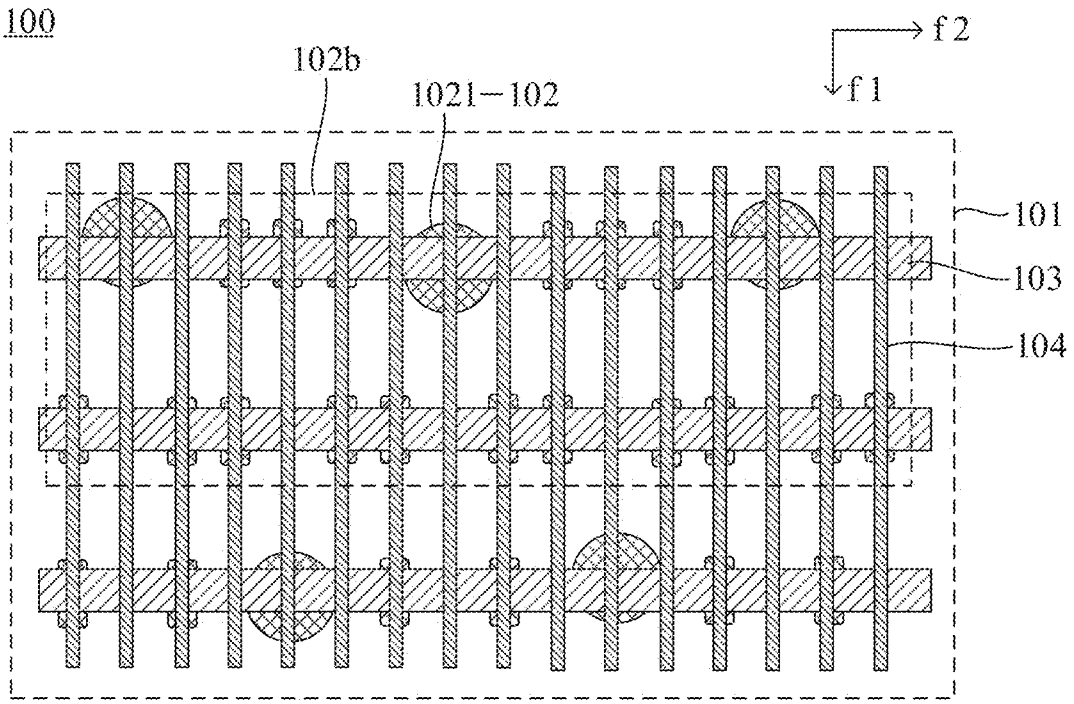
FIG. 19 is a schematic structural diagram of still another array substrate according to some embodiments of the present disclosure.

FIG. 19 is a schematic structural diagram of still another array substrate 100 according to some embodiments of the present disclosure. Referring to FIG. 19, in an optional implementation, the plurality of reflective portions 1021 in one row of reflective portions 1021 include reflective portions 1021 of which the orthographic projections on the base 101 are circular in shape, and also include reflective portions 1021 of which the orthographic projections on the base 101 are rectangular in shape, which can increase the flexibility of combinations of the reflective portions 1021 in the light-reflective pattern 102.

Figure 20:
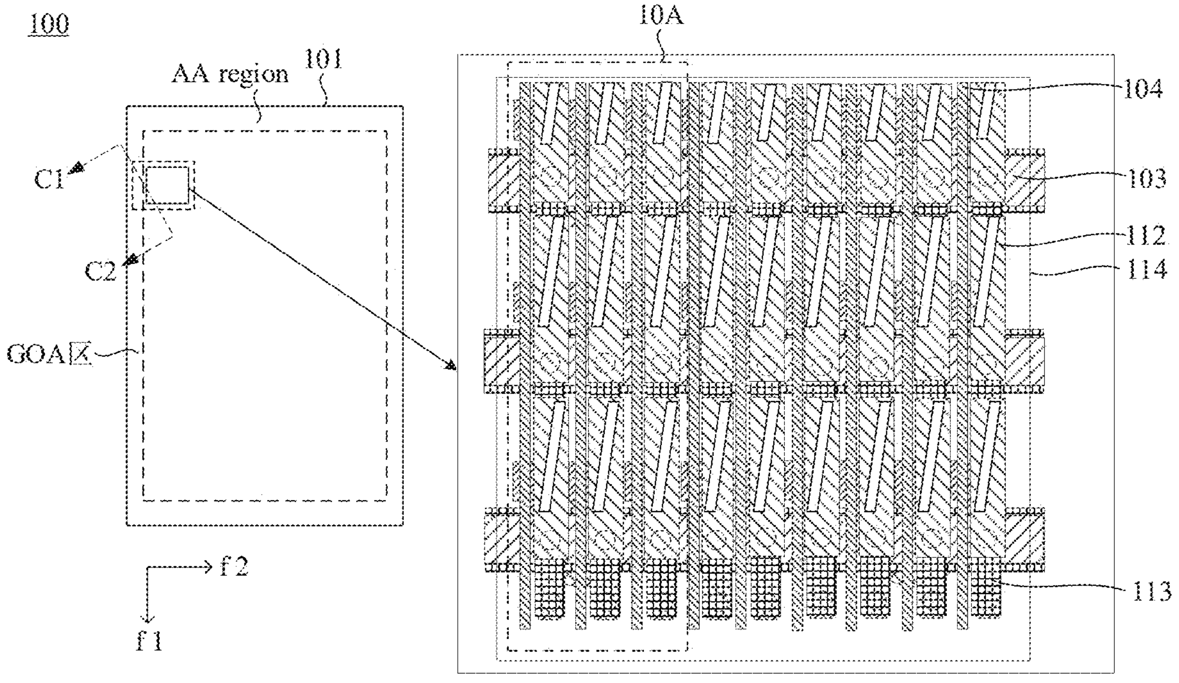
FIG. 20 is a schematic structural diagram of still another array substrate according to some embodiments of the present disclosure.
Figure 21:
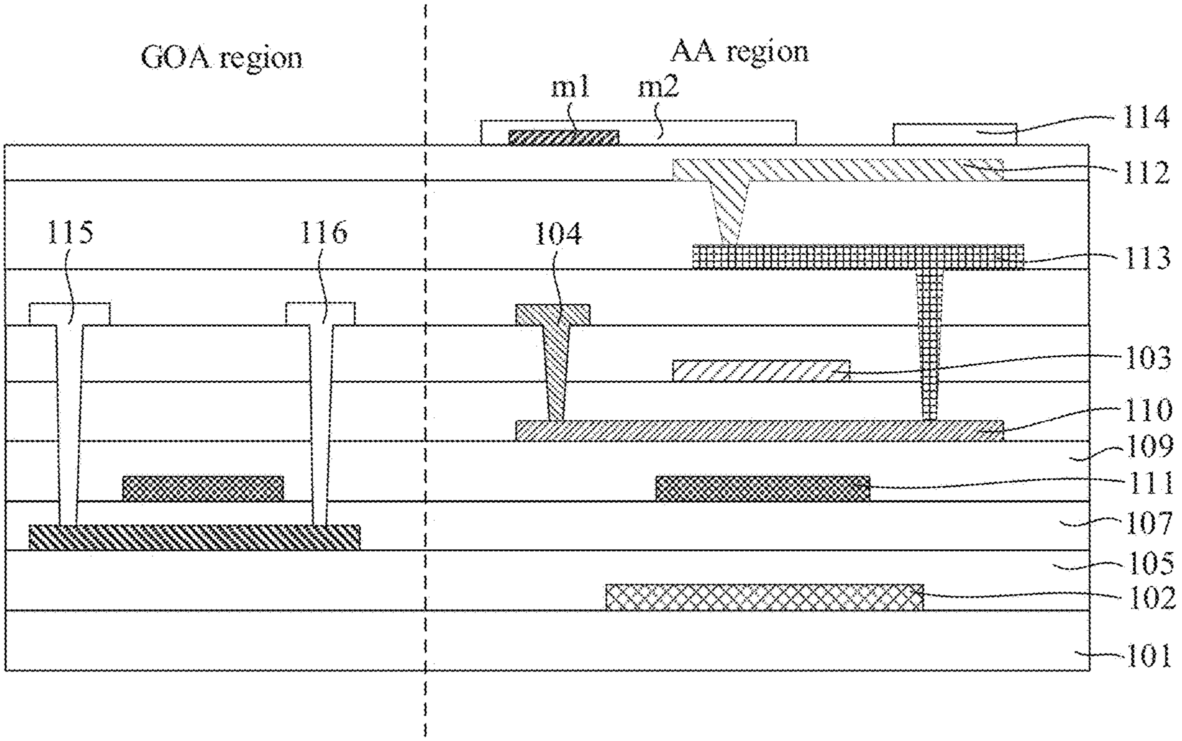
FIG. 21 is a schematic diagram of a cross-sectional structure along C1-C2 of the array substrate shown in FIG. 20.
Figure 22:
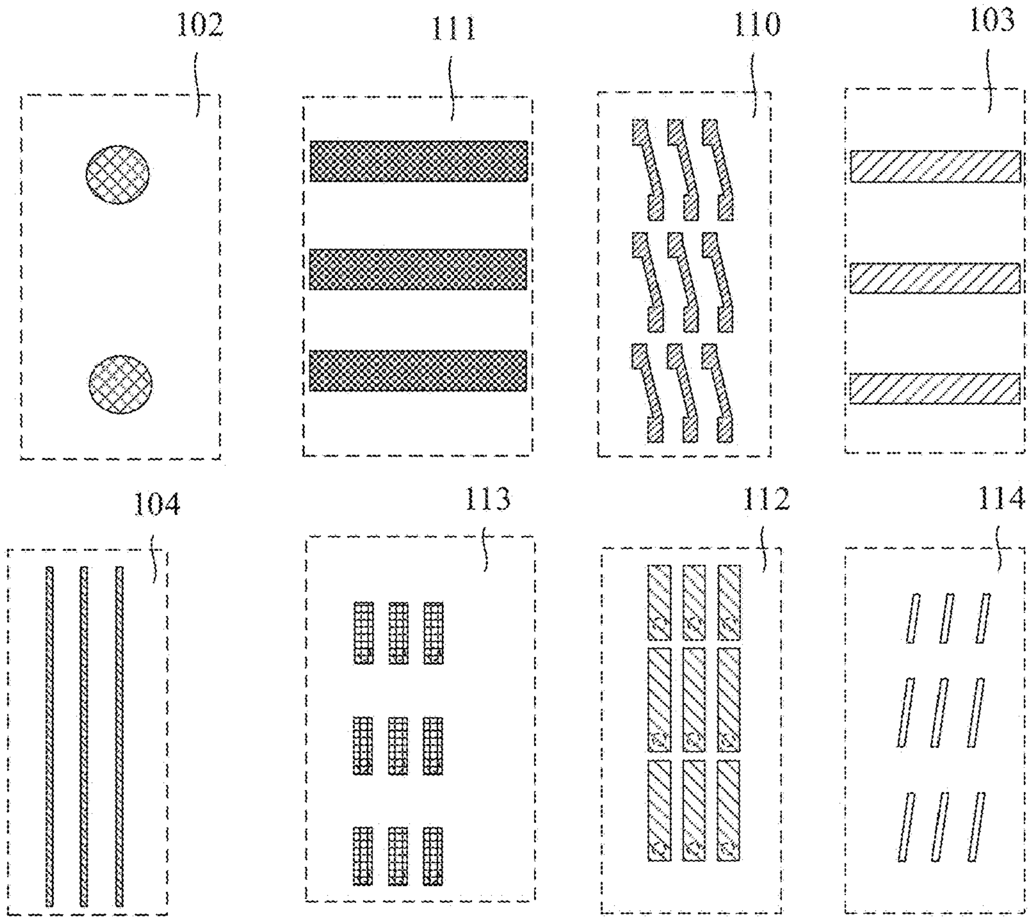
FIG. 22 is a schematic diagram of some film layers in local region of the array substrate shown in FIG. 20.

FIG. 20 is a schematic structural diagram of still another array substrate 100 according to some embodiments of the present disclosure; FIG. 21 is a schematic diagram of a cross-sectional structure along C1-C2 of the array substrate 100 shown in FIG. 20; and FIG. 22 is a schematic diagram of some film layers in local region 10A of the array substrate 100 shown in FIG. 20. Referring to FIG. 20, FIG. 21 and FIG. 22, in some embodiments, the array substrate 100 also includes a pixel electrode 112 disposed on the side of the first active layer away from the base 101. The material of the pixel electrode 112 includes a light-transmissive conductive material, which can improve the light transmittance of the array substrate 100, thereby improving the aperture ratio of the display panel including the array substrate 100. For example, the material of the pixel electrode 112 includes a light-transmissive conductive material, and the light-transmissive conductive material includes indium tin oxide (ITO).

The first active layer includes a source contact portion, a drain contact portion, and an intermediate portion disposed between the source contact portion and the drain contact portion. The dimensions of the source contact portion and the drain contact portion in the second direction f2 are larger than the dimension of the intermediate portion in the second direction f2. The orthographic projection of the first active layer on the base 101 is wider at two ends and narrower in the middle, which can facilitate the electrical connection of the two ends of the first active layer with other structures in the array substrate 100.

In some embodiments, the array substrate 100 further includes a connection electrode 113. The connection electrode 113 is disposed on the side of the first gate signal line 103 away from the base 101, one end of the connection electrode 113 is electrically connected to the first drain, and the other end of the connection electrode 113 is electrically connected to the pixel electrode 112. The material of the connection electrode 113 includes a light-transmissive conductive material, which can increase the light transmittance of the array substrate 100, thereby increasing the aperture ratio of the display panel including the array substrate 100. For example, the light-transmissive conductive material of the connection electrode 113 includes ITO.

As shown in FIG. 7, an acute angle is defined between the extension direction of the first active layer and the extension direction of the data line, so that one end of the first active layer can be electrically connected to the data line, and the other end of the first active layer can be electrically connected to the connection electrode 113.

In some embodiments, the array substrate 100 further includes a common electrode pattern 114, and the common electrode pattern 114 is disposed on the side of the pixel electrode 112 away from the base 101. The pixel electrode 112 drives the liquid crystals in the liquid crystal layer of the display panel together with the common electrode pattern 114.

The common electrode pattern 114 includes a first electrode portion, and the material of the first electrode portion includes metal. The first electrode portion includes a plurality of first strip-shaped electrodes m1. Because the pixel structure in the display panel having higher pixels per inch (PPI) has a smaller size, and the spacing between adjacent pixel structures is relatively smaller, light rays emitted from various pixels are more prone to color crosstalk, which affects the display effect of the display panel. The first electrode portion can prevent the light rays emitted from regions where the pixel structures of different colors are disposed from being emitted out from the regions where the adjacent pixel structures are disposed, which can improve the color crosstalk of the display panel.

The common electrode pattern 114 further includes a transparent electrode layer m2, and the first electrode portion is disposed on the side of the transparent electrode layer m2 close to the base 101. The transparent electrode layer m2 is a whole layer structure. The transparent electrode layer m2 of the whole layer and the plurality of first strip-shaped electrodes m1 of the first electrode portion are laminated, such that the common electrode pattern 114 is a slit electrode. By setting slits in different directions and changing the patterns of the slit electrodes, the liquid crystals in the display panel can be arranged towards a plurality of directions in the horizontal direction in the pixel region, which can improve the uniformity of the brightness of the image displayed on the display panel and reduce the color shift of the display panel. That is, a multi-dimensional electric field can be formed by the electric field generated by the slit electrodes and the electric field generated by the transparent electrode layer of the whole layer, so that all liquid crystals between the slit electrodes and directly above the slit electrodes can rotate, which can increase the operating efficiency of the liquid crystals in the display panel, and increase the light transmittance of the liquid crystals in the display panel.

Alternatively, a plurality of openings are formed in the transparent electrode layer m2 to form the slit electrodes, which is not limited in the embodiments of the present disclosure.

In addition, the transparent electrode layer can protect the first electrode portion, and prevent the first electrode portion from being corroded by external moisture to prevent the first electrode portion from being damaged. The material of the transparent electrode layer includes ITO.

In some embodiments, referring to FIG. 21, the array substrate 100 further includes a second source 115 and a second drain 116 which are disposed on the side of the second active layer away from the base 101. The materials of the second source 115 and the second drain 116 include metal, and the second source 115 and the second drain 116 are both electrically connected to the second active layer, which is not elaborated in the embodiments of the present disclosure.

Figure 23:
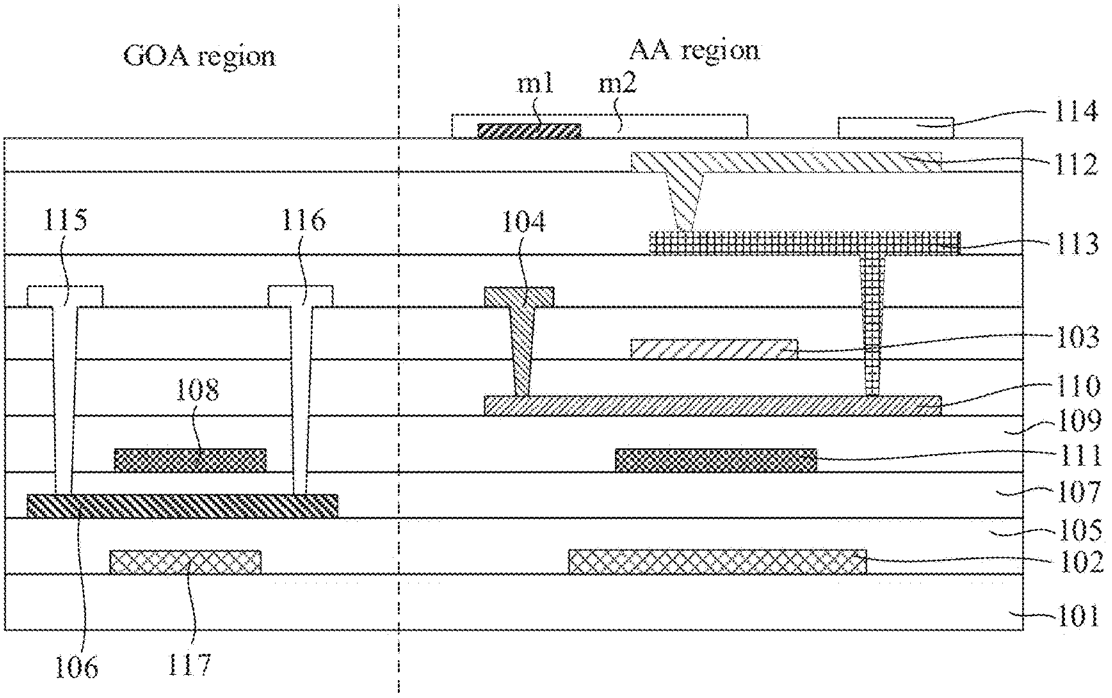
FIG. 23 is a schematic diagram of another cross-sectional structure along C1-C2 of the array substrate shown in FIG. 20.

FIG. 23 is a schematic diagram of another cross-sectional structure along C1-C2 of the array substrate 100 shown in FIG. 20. Referring to FIG. 23, the array substrate 100 further includes a light-blocking pattern 117 disposed on the side of the second active layer close to the base 101, the second active layer has a channel region, and the orthographic projection of the channel region on the base 101 is within the orthographic projection of the light-blocking pattern 117 on the base 101. The light-blocking pattern 117 is configured to block light rays (e.g., light rays emitted from the backlight source on the display panel) from being incident to the second active layer, so as to prevent the light rays from affecting the stability of the channel region of the second active layer. The light-blocking pattern 117 is disposed in the same layer as the light-reflective pattern 102. The difference value between the width of the orthographic projection of the light-blocking pattern 117 on the base 101 and the width of the second gate signal line 108 ranges from 1 μm to 5 μm.

Figure 24:
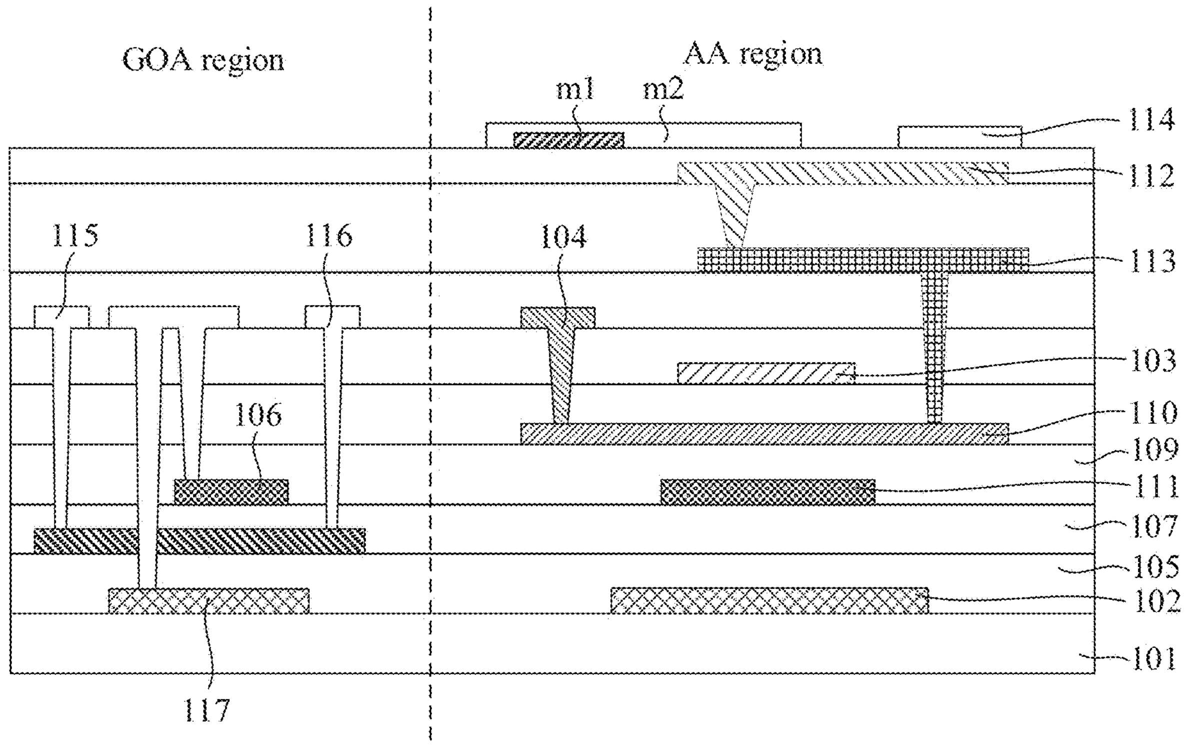
FIG. 24 is a schematic diagram of still another cross-sectional structure along C1-C2 of the array substrate shown in FIG. 20.

FIG. 24 is a schematic diagram of still another cross-sectional structure along C1-C2 of the array substrate 100 shown in FIG. 20. Referring to FIG. 24, the light-blocking pattern 117 is further electrically connected to the second gate signal line 108, so that the thin-film transistor in the GOA region includes a dual-gate thin-film transistor. Thus, while having a light-shielding effect, the light-blocking pattern 117 can also increase the output capability of the thin-film transistor in the GOA region.

The array substrate 100 provided in the embodiments of the present disclosure is applicable to small-sized mobile devices, notebook computers (NB), tablet computers, small and medium-sized monitors (MNT), medium and large-sized televisions (TV), medium and large-sized MNTs, and other products.

The array substrate 100 provided in the embodiments of the present disclosure is applicable to the display field, chip field, sensors, or other technology fields. For the display field, the array substrate 100 is applicable to liquid crystal display (LCD) panels, organic light-emitting diode (OLED) display panels, quantum dot light-emitting diode (QLED) display panels, micro light-emitting diode (micro LED) display panels, and the like.

In summary, the embodiments of the present disclosure provide an array substrate including a base, a light-reflective pattern, a plurality of first gate signal lines, and a plurality of data signal lines. The light-reflective pattern includes a plurality of reflective portions and an opening region is defined between two adjacent reflective portions. Since the first gate signal lines and the data signal lines are film layers having lower light transmittance, the light-reflective pattern overlaps at least partially with the first gate signal lines and the data signal lines, and when light rays from a light source are irradiated to the light-reflective pattern, the light-reflective pattern can reflect the light rays from the light source to the other film layers. The other film layers reflect at least part of the light rays from the light source towards the side of the light-reflective pattern away from the base. Thus, the backlight utilization rate of the display panel including the array substrate can be improved by the light-reflective pattern, and the influence of the first gate signal lines and the data signal lines which have lower light transmittance on the light transmittance of the array substrate can be reduced. In this way, the problem of a poor display effect of a display panel adopting the array substrate in some practices can be solved, and the display effect of the display panel can be improved.

Figure 25:
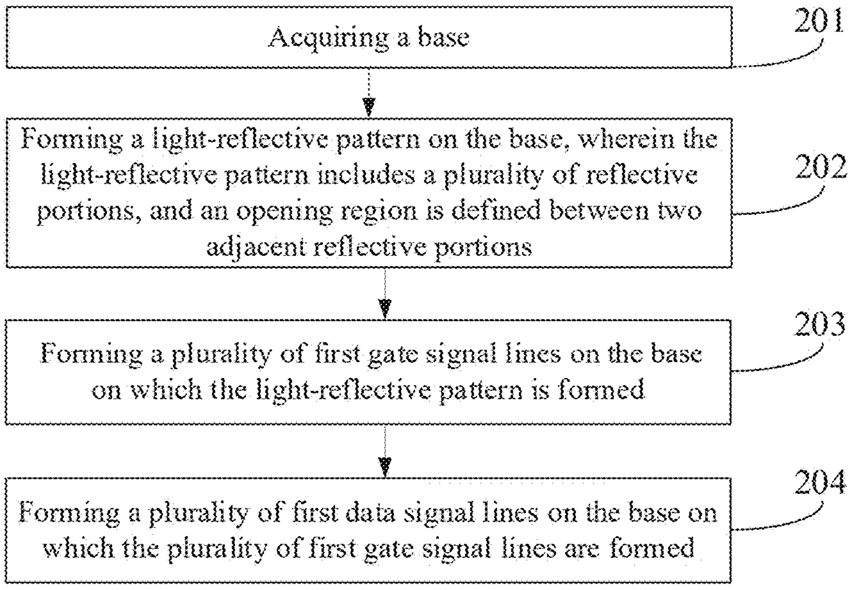
FIG. 25 is a flowchart of a method for manufacturing an array substrate according to some embodiments of the present disclosure.

FIG. 25 is a flowchart of a method for manufacturing an array substrate 100 according to some embodiments of the present disclosure. The method is used to manufacture the array substrate 100 provided in the above embodiments, such as the array substrate 100 in any one of the above embodiments. Referring to FIG. 25, the method includes the following steps.

In step 201, a base is acquired.

In step 202, a light-reflective pattern is formed on the base, wherein the light-reflective pattern includes a plurality of reflective portions, and an opening region is defined between two adjacent reflective portions.

In step 203, a plurality of first gate signal lines are formed on the base on which the light-reflective pattern is formed.

In step 204, a plurality of first data signal lines are formed on the base on which the plurality of first gate signal lines are formed.

The orthographic projection of the first gate signal line on the base and the orthographic projection of the data signal line on the base have a first overlapping region, and the orthographic projection of the reflective portion on the base overlaps with the first overlapping region.

In summary, the embodiments of the present disclosure provide a method for manufacturing an array substrate. The array substrate includes a base, a light-reflective pattern, a plurality of first gate signal lines, and a plurality of data signal lines. The light-reflective pattern includes a plurality of reflective portions and an opening region is defined between two adjacent reflective portions. Since the first gate signal lines and the data signal lines are film layers having lower light transmittance, the light-reflective pattern overlaps at least partially with the first gate signal lines and the data signal lines, and when light rays from a light source are irradiated to the light-reflective pattern, the light-reflective pattern can reflect the light rays from the light source to the other film layers. The other film layers reflect at least part of the light rays from the light source towards the side of the light-reflective pattern away from the base. Thus, the backlight utilization rate of the display panel including the array substrate can be improved by the light-reflective pattern, and the influence of the first gate signal lines and the data signal lines which have lower light transmittance on the light transmittance of the array substrate can be reduced. In this way, the problem of a poor display effect of a display panel adopting the array substrate in some practices can be solved, and the display effect of the display panel can be improved.

Figure 26:
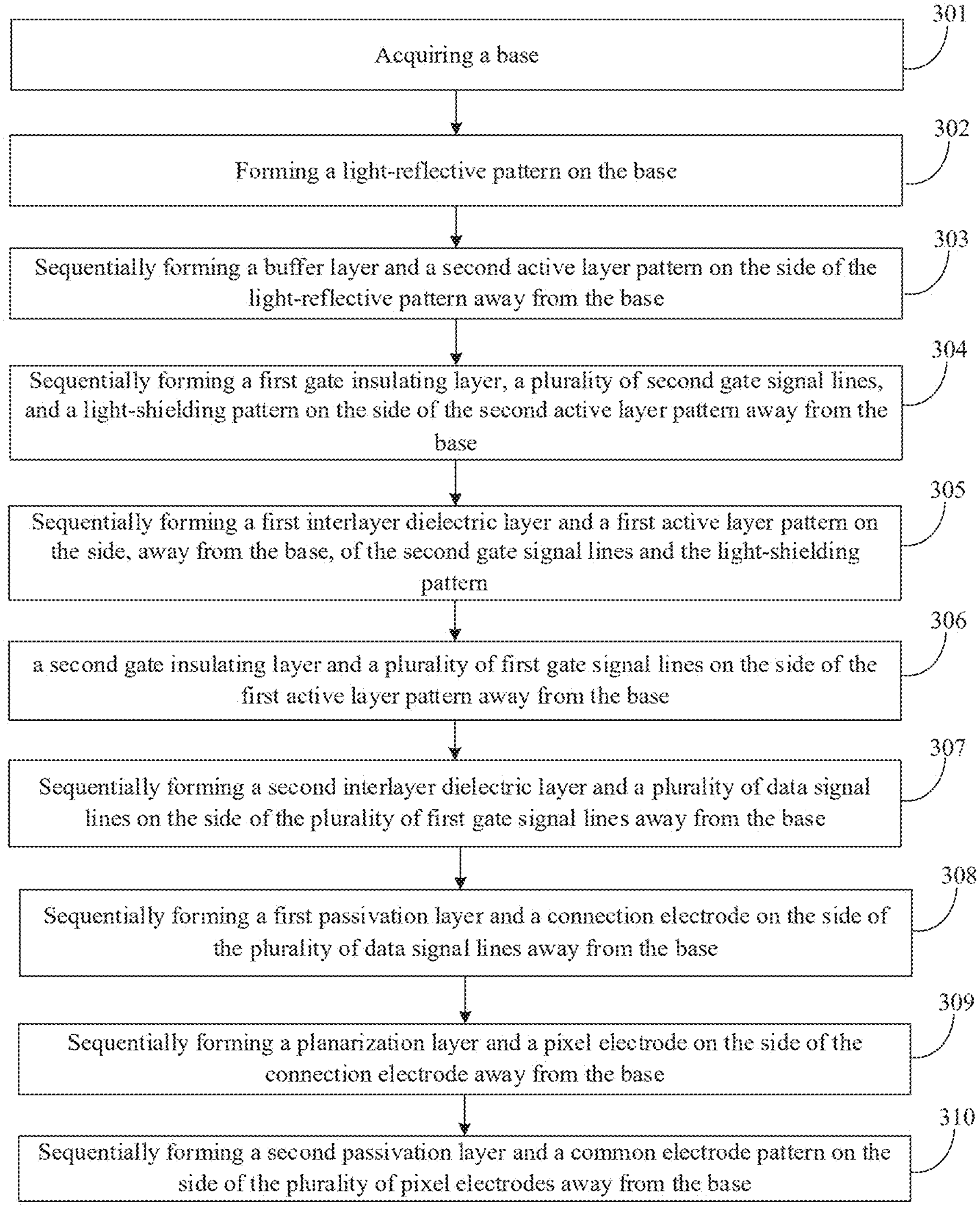
FIG. 26 is a flowchart of another method for manufacturing a substrate according to some embodiments of the present disclosure.

FIG. 26 is a flowchart of another method for manufacturing a substrate according to some embodiments of the present disclosure. The method is used to manufacture the substrate provided in the above embodiments, such as the substrate shown in FIG. 21. Referring to FIG. 26, the method includes the following steps.

In step 301, a base is acquired.

The base 101 is a flexible substrate, which is made of a flexible material (e.g., a polyimide PI material). Alternatively, the base 101 substrate is a glass substrate.

In step 302, a light-reflective pattern is formed on the base.

The light-reflective pattern 102 includes a plurality of reflective portions 1021, and an opening region is defined two adjacent reflective portions 1021. The material of the light-reflective pattern 102 includes at least one of molybdenum, aluminum, titanium, and argentum, and the light-reflective pattern 102 has a thickness in a range of 50 angstroms to 2000 angstroms.

Figure 27:
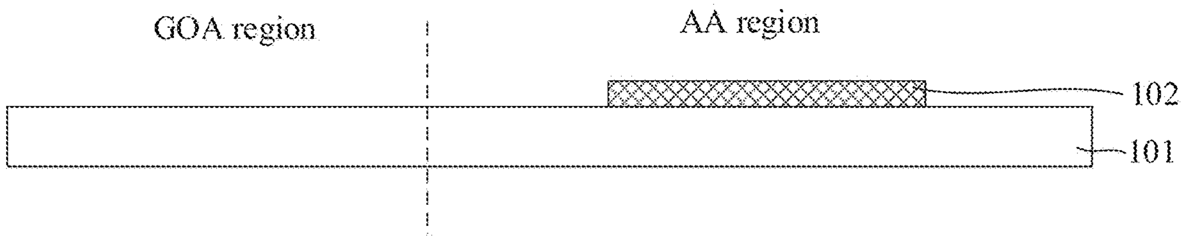
FIG. 27 is a schematic diagram of a film layer structure of a light-reflective pattern formed on a base according to some embodiments of the present disclosure.
Figure 28:
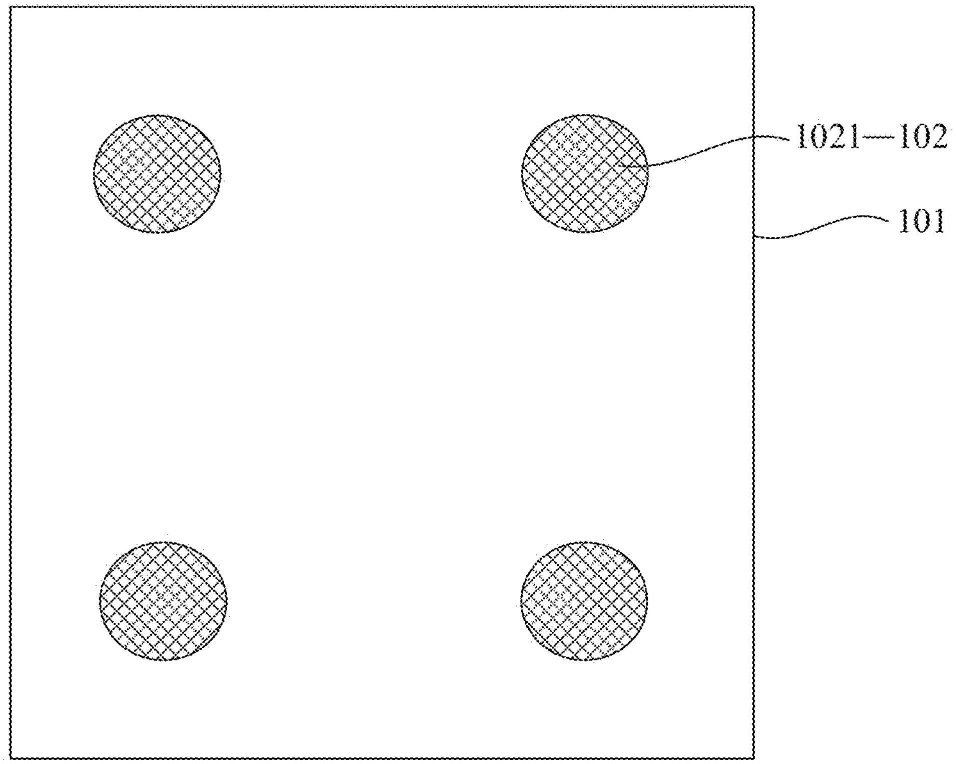
FIG. 28 is a schematic diagram of a partial film layer structure in a display region corresponding to FIG. 27.

In some embodiments, referring to FIG. 27 and FIG. 28, FIG. 27 is a schematic diagram of a film layer structure of a light-reflective pattern 102 formed on a base according to some embodiments of the present disclosure, and FIG. 28 is a schematic diagram of a partial film layer structure in the display region corresponding to FIG. 27. A metal film is formed on a side of the base 101 by any one of deposition, coating, sputtering, and the like, and then a single patterning process (including exposure and an etching process) is performed on the metal film to form the light-reflective pattern 102. The etching process includes a dry etching process, and a slope angle of the formed light-reflective pattern 102 ranges from 45° to 90°.

In step 303, a buffer layer and a second active layer pattern are sequentially formed on the side of the light-reflective pattern away from the base.

The material of the buffer layer 105 includes an organic insulating material or an inorganic insulating material. The material of the second active layer pattern 106 is low temperature poly-silicon. The thickness of the second active layer pattern 106 ranges from 300 angstroms (Å) to 800 Å, and the second active layer pattern 106 is disposed in the GOA region of the array substrate 100.

Figure 29:
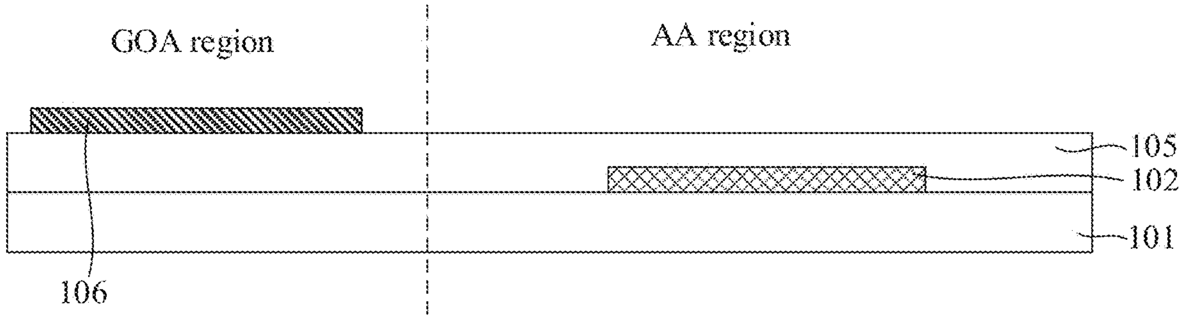
FIG. 29 is a schematic diagram of a film layer structure where a buffer layer and a second active layer pattern are formed according to some embodiments of the present disclosure.

In some embodiments, referring to FIG. 29, FIG. 29 is a schematic diagram of a film layer structure where a buffer layer 105 and a second active layer pattern 106 are formed according to some embodiments of the present disclosure. The buffer layer 105 is formed on the side of the light-reflective pattern 102 away from the base 101 by any one of deposition, coating, sputtering, and the like. A second active layer film is formed on the side of the buffer layer 105 away from the base 101 by any one of deposition, coating, sputtering, and the like, and then a single patterning process is performed on the second active layer film to form a plurality of second active layer pattern 106.

In step 304, a first gate insulating layer, a plurality of second gate signal lines, and a light-shielding pattern are sequentially formed on the side of the second active layer pattern away from the base.

In some embodiments, the material of the first gate insulating layer 107 includes silicon oxide, so that the second active layer pattern 106 is not directly conductive. The material of the second gate signal line 108 is a metal material. For example, the material of the second gate signal line 108 is at least one of copper, titanium, molybdenum, and the second gate signal line 108 is a titanium/aluminum/titanium laminated structure. The light-shielding pattern 111 is in the same layer as the second gate signal line 108, and is made of the same material as the second gate signal line 108.

Figure 30:
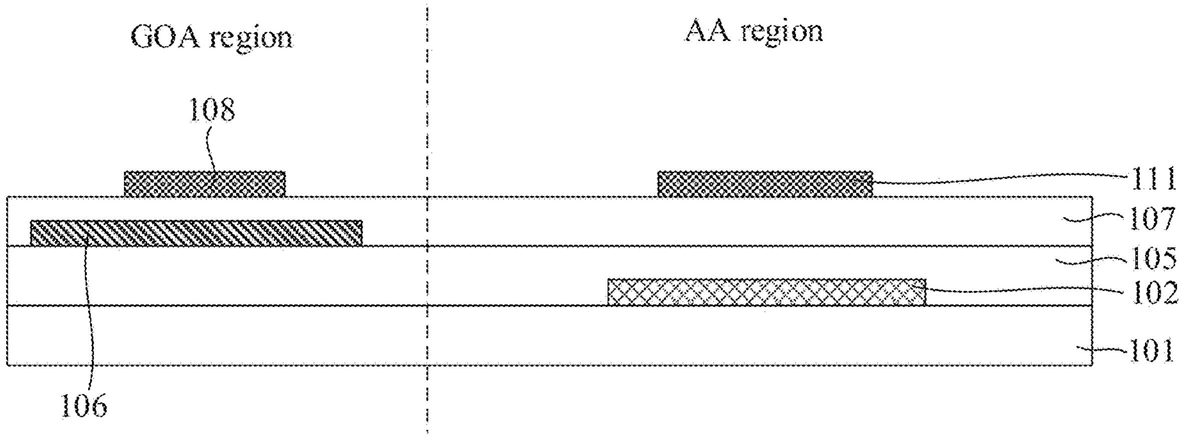
FIG. 30 is a schematic diagram of a film layer structure where a first gate insulating layer, a plurality of second gate signal lines and a light-shielding pattern are formed according to some embodiments of the present disclosure.
Figure 31:
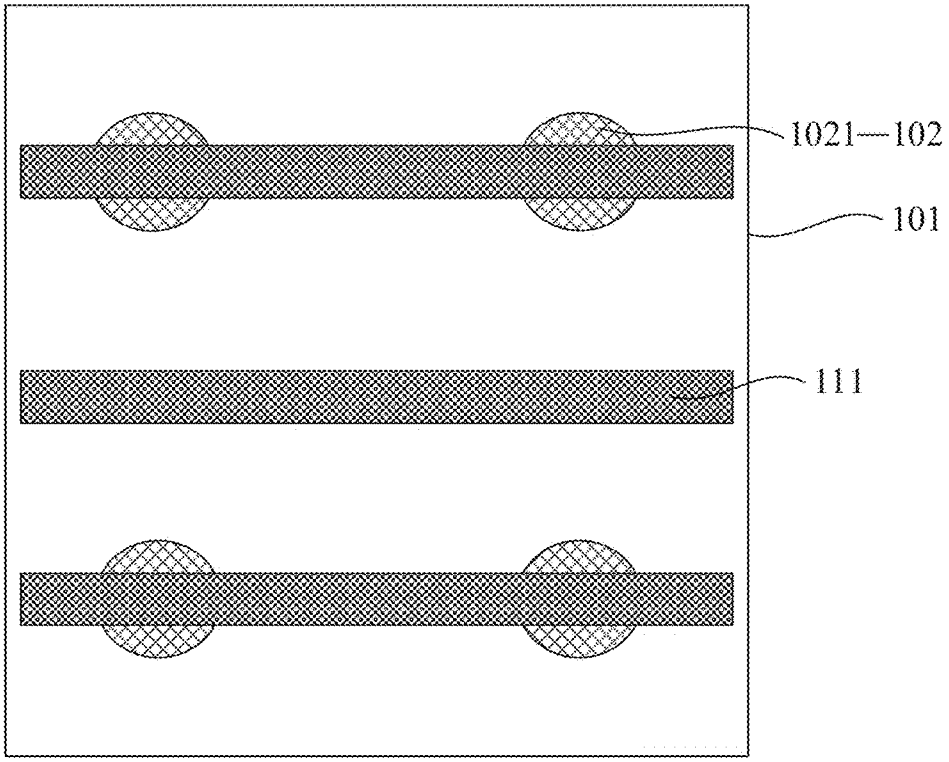
FIG. 31 is a schematic diagram of a partial film layer structure in a display region corresponding to FIG. 30.

In some embodiments, referring to FIG. 30 and FIG. 31, FIG. 30 is a schematic diagram of a film layer structure where the first gate insulating layer 107, a plurality of second gate signal lines 108 and the light-shielding pattern 111 are formed according to some embodiments of the present disclosure, and FIG. 31 is a schematic diagram of a partial film layer structure in the display region corresponding to FIG. 30. The first gate insulating layer 107 is formed on the side of the second active layer pattern 106 away from the base 101 by any one of deposition, coating, sputtering, and the like.

A metal film is formed on the first gate insulating layer 107, and then a single patterning process is formed on the metal film to form the plurality of second gate signal lines 108 and the light-shielding pattern 111. Here, the plurality of second gate signal lines 108 are insulated from the second active layer pattern 106 by the first gate insulating layer 107.

In step 305, a first interlayer dielectric layer and a first active layer pattern are sequentially formed on the side, away from the base, of the second gate signal lines and the light-shielding pattern.

The material of the first interlayer dielectric layer 109 includes silicon oxide. The material of the first active layer pattern 110 is a transparent oxide semiconductor material. For example, the material of the first active layer pattern 110 is IGZO.

Figure 32:
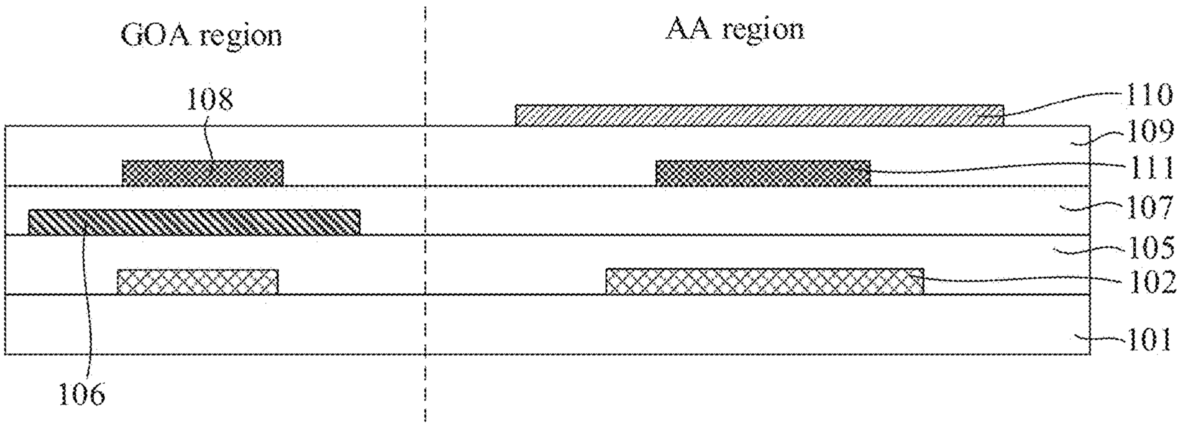
FIG. 32 is a schematic diagram of a film layer structure where a first interlayer dielectric layer and a first active layer pattern are formed according to some embodiments of the present disclosure.
Figure 33:
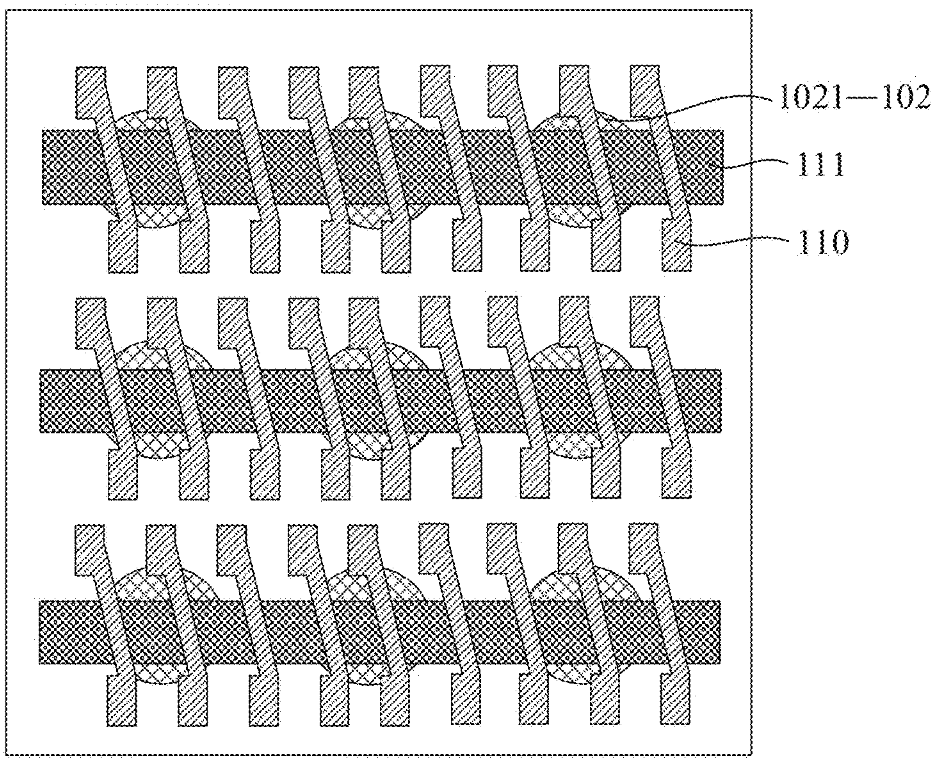
FIG. 33 is a schematic diagram of a film layer structure in a display region corresponding to FIG. 32.

In some embodiments, referring to FIG. 32 and FIG. 33, FIG. 32 is schematic diagram of a film layer structure where the first interlayer dielectric layer 109 and the first active layer pattern 110 are formed according to some embodiments of the present disclosure, and FIG. 33 is a schematic diagram of a film layer structure in the display region corresponding to FIG. 32.

The first interlayer dielectric layer 109 is formed on the side of the second gate signal lines 108 and the light-shielding pattern 111 away from the base 101 by any one of deposition, coating, sputtering, and the like. Furthermore, a semiconductor film is formed on the side of the first interlayer dielectric layer 109 away from the base 101 by any one of as deposition, coating, sputtering, and the like, and then a single patterning process is performed the semiconductor film to form the plurality of first active layer patterns 110.

In step 306, a second gate insulating layer and a plurality of first gate signal lines are sequentially formed on the side of the first active layer pattern away from the base.

In some embodiments, the material of the second gate insulating layer 118 includes silicon oxide. The material of the first gate signal line 103 is a metal material. For example, the material of the first gate signal line 103 is at least one of copper, titanium, molybdenum, and the first gate signal line 103 is a titanium/aluminum/titanium laminated structure. The thickness of the first gate signal line 103 ranges from 1500 Å to 6000 Å.

Figure 34:
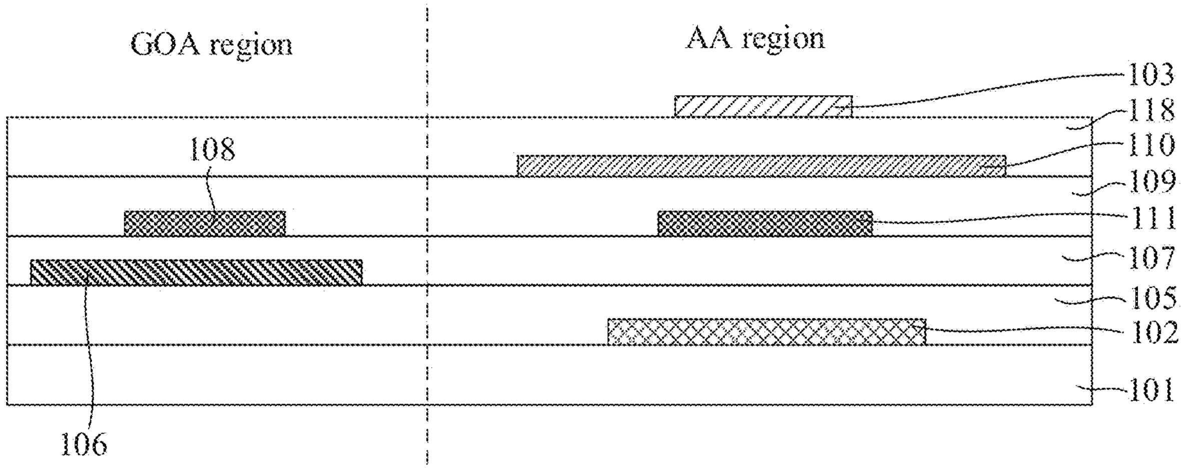
FIG. 34 is a schematic diagram of a film layer structure where a second gate insulating layer and a first gate signal line are formed according to some embodiments of the present disclosure.
Figure 35:
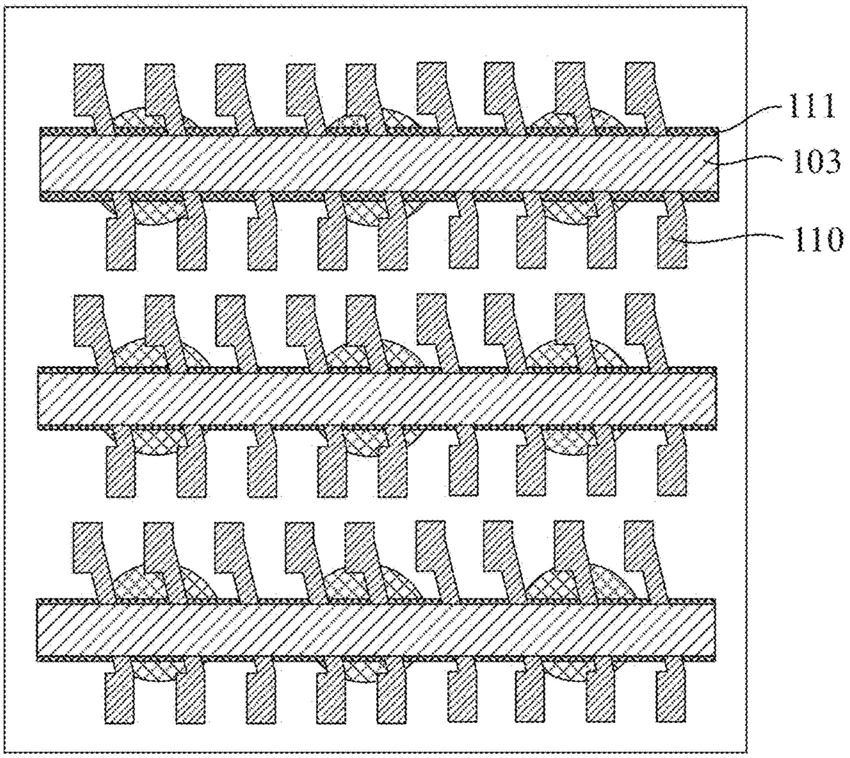
FIG. 35 is a schematic diagram of a partial film layer structure in a display region corresponding to FIG. 34.

In some embodiments, referring to FIG. 34 and FIG. 35, FIG. 34 is a schematic diagram of a film layer structure where the second gate insulating layer 118 and the first gate signal line 103 are formed according to some embodiments of the present disclosure and FIG. 35 is schematic diagram of a partial film layer structure in the display region corresponding to FIG. 34. The second gate insulating layer 118 is formed on the side of the first active layer pattern 110 away from the base 101 by any one of deposition, coating, sputtering, and the like.

A metal film is formed on the second gate insulating layer 118, and then a single patterning process is performed on the metal film to form the plurality of first gate signal lines 103.

Here, the plurality of first gate signal lines 103 are insulated from the first active layer pattern 110 by the second gate insulating layer 118.

In step 307, a second interlayer dielectric layer and a plurality of data signal lines are sequentially formed on the side of the plurality of first gate signal lines away from the base.

The material of the second interlayer dielectric layer 119 (ILD2) includes silicon oxide. The material of the data signal line 104 is a metal material. For example, the material of the data signal line 104 is a metal material such as copper, titanium, molybdenum, or an alloy. The data signal line 104 is a titanium/aluminum/titanium laminated structure, and the thickness of the data signal line 104 ranges from 2000 Å to 8000 Å.

Figure 36:
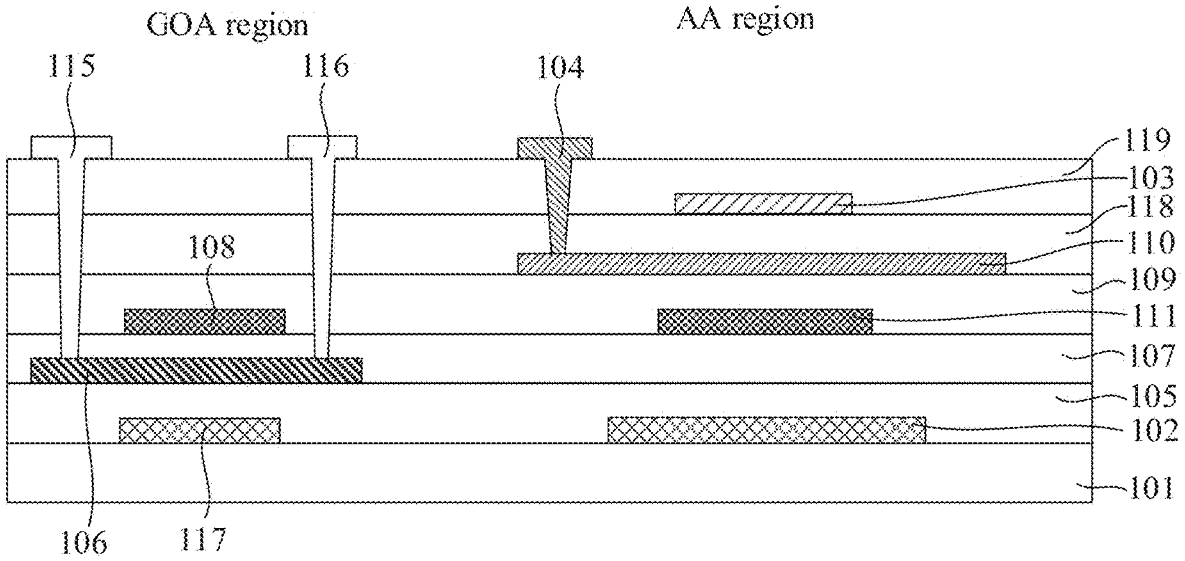
FIG. 36 is a schematic diagram of a film layer structure where a second interlayer dielectric layer and a plurality of data signal lines are formed according to some embodiments of the present disclosure.
Figure 37:
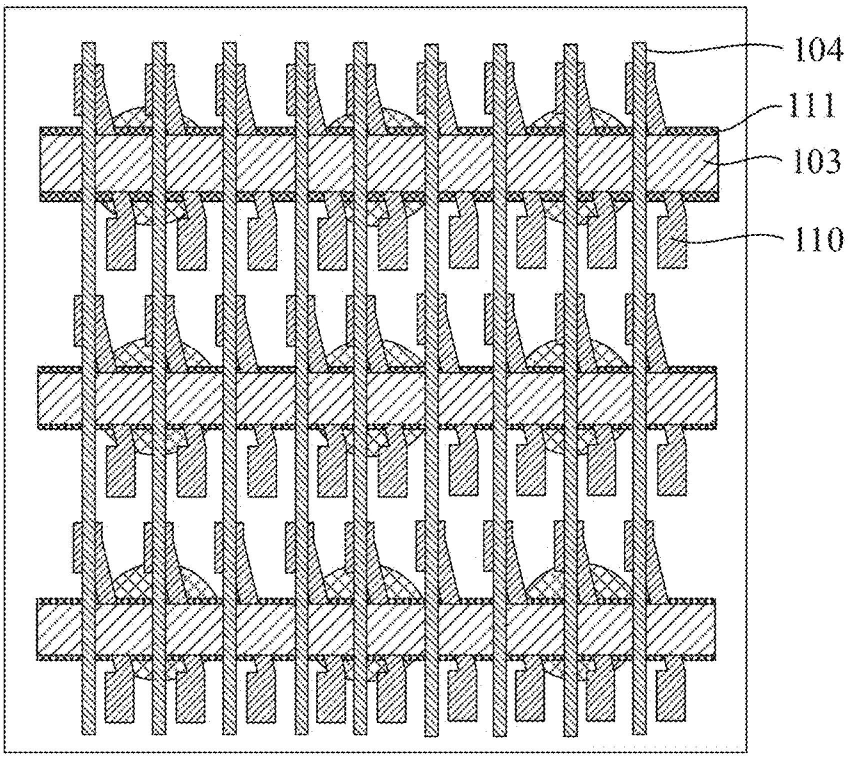
FIG. 37 is a schematic diagram of a partial film layer structure in a display region corresponding to FIG. 36.

In some embodiments, referring to FIG. 36 and FIG. 37, FIG. 36 is a schematic diagram of a film layer structure where the second interlayer dielectric layer 119 and the plurality of data signal lines 104 are formed according to some embodiments of the present disclosure, and FIG. 37 is a schematic diagram of a partial film layer structure in the display region corresponding to FIG. 36.

The second interlayer dielectric layer 119 is formed on the side of the first gate signal lines 103 and the light-shielding pattern 111 away from the base 101 by any one of deposition, coating, sputtering, and the like. Furthermore, a metal film is formed on the second interlayer dielectric layer 119 by any one of deposition, coating, sputtering, and the like, and then a single patterning process is performed on the metal film to form the plurality of data signal lines 104.

The plurality of data signal lines 104 include data signal lines 104 disposed in the AA region, and the data signal lines 104 disposed in the AA region are electrically connected to the first active layer through via holes penetrating through the second interlayer dielectric layer 119 and the second gate insulating layer 118.

The orthographic projection of the data signal line 104 disposed in the AA region on the base 101 and the orthographic projection of the first gate signal line 103 on the base 101 have a first overlapping region c1, the first overlapping region c1 overlaps with the orthographic projection of the reflective portion 1021 on the base 101, and at least one first overlapping region c1 of a plurality of first overlapping regions c1 is in the orthographic projection of the reflective portion 1021 on the base 101.

In addition, a second source 115 and a second drain 116 are formed in the GOA region of the array substrate 100, and the second source 115 and the second drain 116 disposed in the GOA region are electrically connected to the second active layer through via holes penetrating through the second interlayer dielectric layer 119, the second gate insulating layer 118, the first interlayer dielectric layer 109, and the first gate insulating layer 107.

In step 308, a first passivation layer and a connection electrode are sequentially formed on the side of the plurality of data signal lines away from the base.

In some embodiments, the first passivation layer 120 (PVX1) is made of an inorganic material such as silicon nitride, silicon oxide, or silicon oxynitride. The material of the connection electrode 113 is a transparent conductive material. For example, the material of the connection electrode 113 is ITO, which can improve the light transmittance of the array substrate 100, and thus increase the aperture ratio of the display panel including the array substrate 100.

Figure 38:
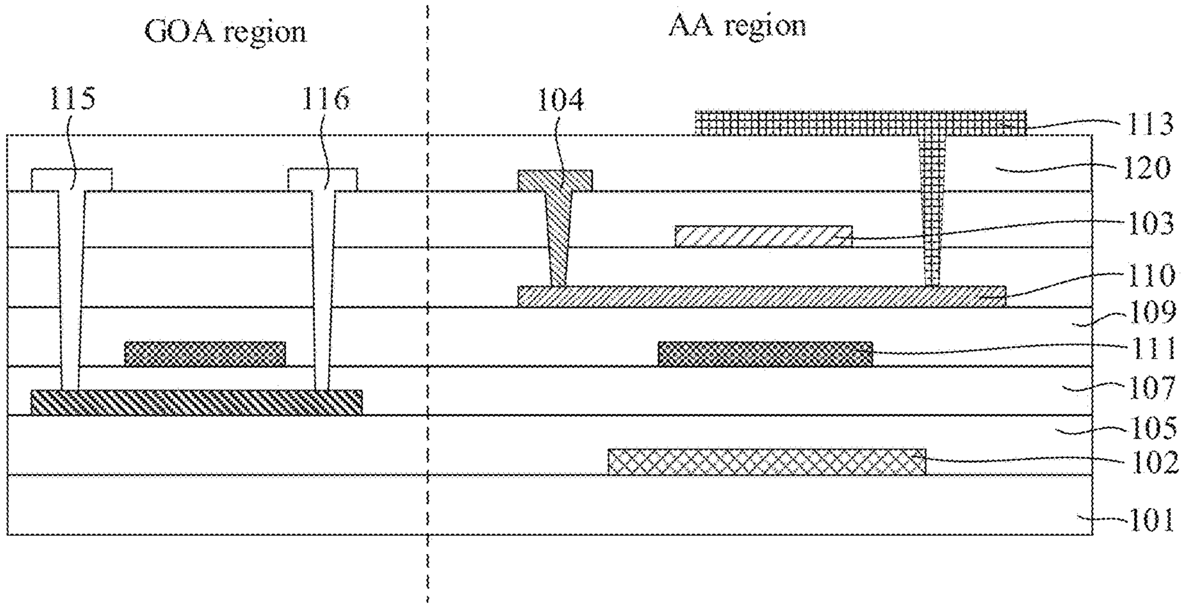
FIG. 38 is a schematic diagram of a film layer structure where a first passivation layer and a connection electrode are formed according to some embodiments of the present disclosure.
Figure 39:
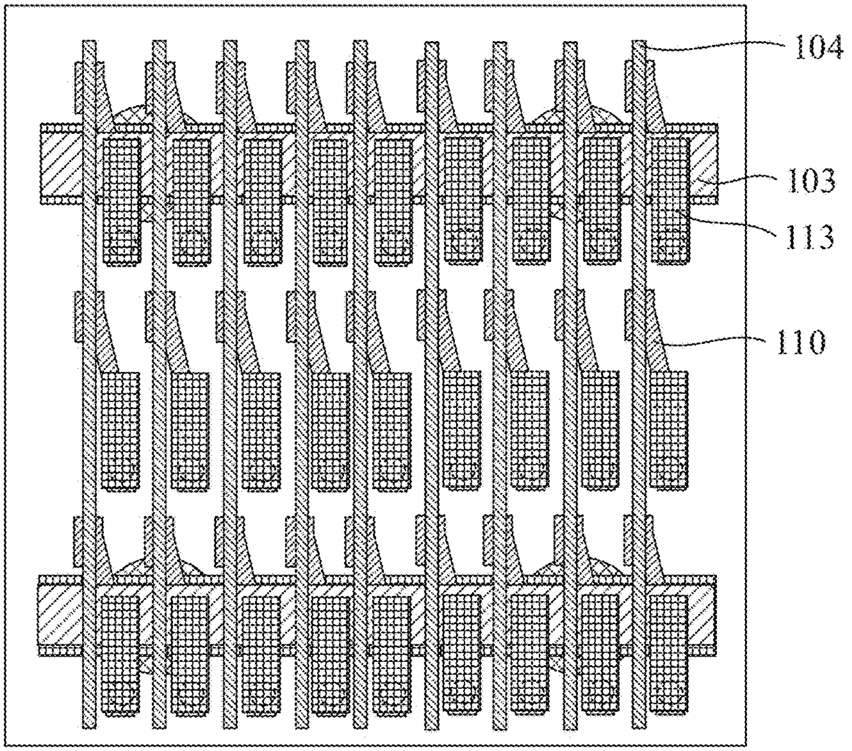
FIG. 39 is a schematic diagram of a partial film layer structure in a display region corresponding to FIG. 38.

In some embodiments, referring to FIG. 38 and FIG. 39, FIG. 38 is a schematic diagram of a film layer structure where the first passivation layer 120 and the connection electrode 113 are formed according to some embodiments of the present disclosure, and FIG. 39 is a schematic diagram of a partial film layer structure in the display region corresponding to FIG. 38. The first passivation layer 120 is formed on the side of the plurality of data signal lines 104 away from the base 101 by any one of deposition, coating, sputtering, and the like. Furthermore, a transparent conductive film is formed on a side of the first passivation layer 120 by any one of deposition, coating, sputtering, and the like, and then a single pattering process is performed the transparent conductive film to form the plurality of connection electrode 113. Each connection electrode 113 is electrically connected to the first active layer through a via hole penetrating through the first passivation layer 120, the second interlayer dielectric layer 119, and the second gate insulating layer.

In step 309, a planarization layer and a pixel electrode are sequentially formed on the side of the connection electrode away from the base.

In some embodiments, the material of the planarization layer 120 (PLN) is an organic material such as resin. The material of the pixel electrode 112 is a transparent conductive material. For example, the material of the pixel electrode 112 is ITO.

Figure 40:
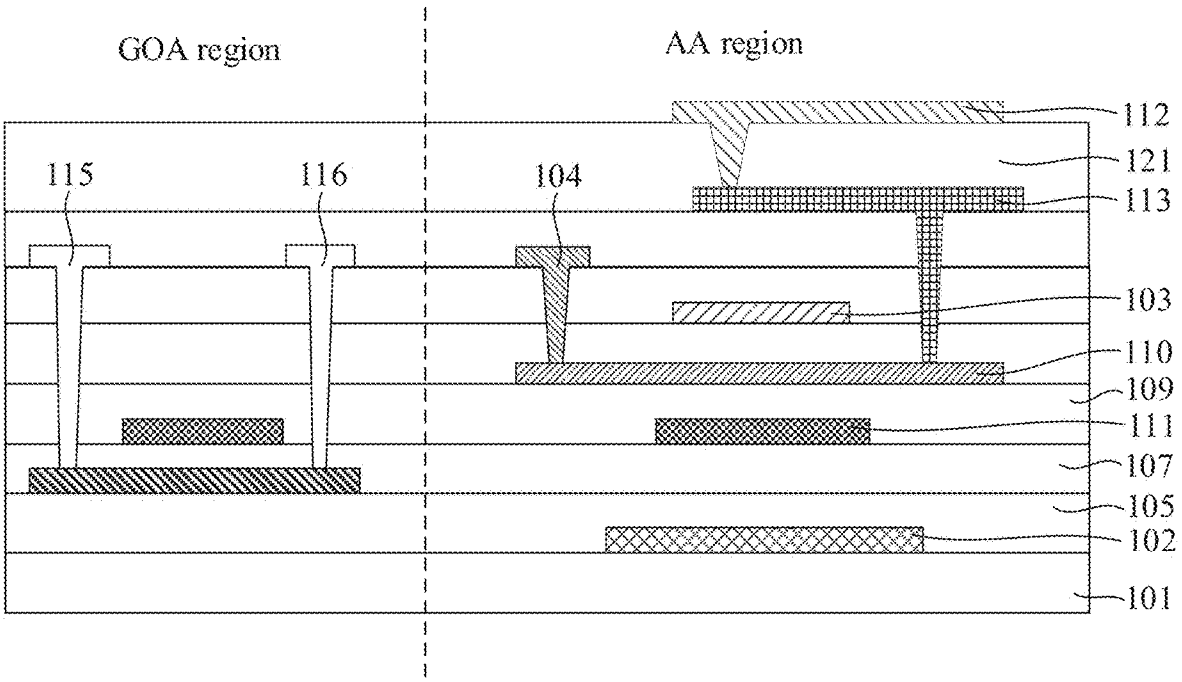
FIG. 40 is a schematic diagram of a film layer structure where a planarization layer and a pixel electrode are formed according to some embodiments of the present disclosure.
Figure 41:
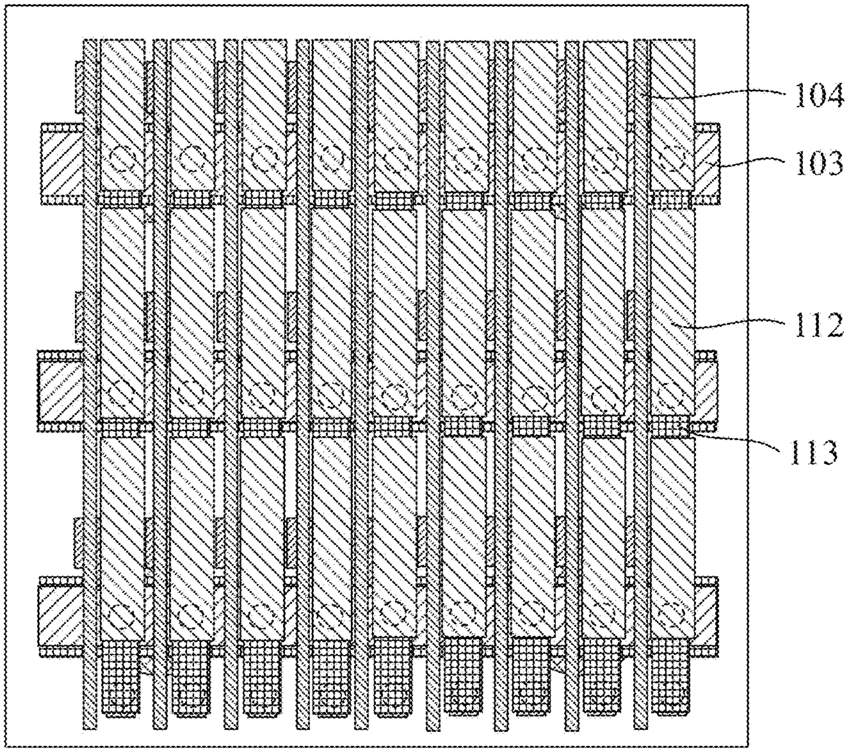
FIG. 41 is a schematic diagram of a partial film layer structure in a display region corresponding to FIG. 40.

In some embodiments, referring to FIG. 40 and FIG. 41, FIG. 40 is a schematic diagram of a film layer structure where the planarization layer 120 and the pixel electrode 112 are formed according to some embodiments of the present disclosure, and FIG. 41 is a schematic diagram of a partial film layer structure in the display region corresponding to FIG. 40. The planarization layer 120 is formed on the side of the connection electrode 113 away from the base 101 by any one of deposition, coating, sputtering, and the like. Furthermore, a transparent conductive film is formed on the side of the planarization layer 120 away from the base 101 by any one of deposition, coating, sputtering, and the like, and then a single patterning process is performed on the transparent conductive film to form the plurality of pixel electrodes 112. Each pixel electrode 112 is electrically connected to the connection electrode 113 through a via hole penetrating through the planarization layer 120.

In step 310, a second passivation layer and a common electrode pattern are sequentially formed on the side of the plurality of pixel electrodes away from the base.

In some embodiments, the second passivation layer 122 (PVX2) is made of an inorganic material such as silicon nitride, silicon oxide, or silicon oxynitride. The common electrode pattern 114 includes a transparent electrode layer, and the transparent electrode layer has openings therein. The material of the transparent electrode layer includes ITO.

In some embodiments, referring to FIG. 20 and FIG. 21, the second passivation layer 122 and the transparent conductive film are sequentially formed on the side of the plurality of pixel electrodes 112 away from the base 101 by any one of deposition, coating, sputtering, and the like, and then a single patterning process is performed on the transparent conductive film to form the transparent electrode layer.

It is to be noted that the single patterning process in the above embodiments includes photoresist coating, exposure, developing, and photoresist stripping.

In summary, the embodiments of the present disclosure provide a method for manufacturing an array substrate. The array substrate includes a base, a light-reflective pattern, a plurality of first gate signal lines, and a plurality of data signal lines. The light-reflective pattern includes a plurality of reflective portions and an opening region is defined between two adjacent reflective portions. Since the first gate signal lines and the data signal lines are film layers having lower light transmittance, the light-reflective pattern overlaps at least partially with the first gate signal lines and the data signal lines, and when light rays from a light source are irradiated to the light-reflective pattern, the light-reflective pattern can reflect the light rays from the light source to the other film layers. The other film layers reflect at least part of the light rays from the light source towards the side of the light-reflective pattern away from the base. Thus, the backlight utilization rate of the display panel including the array substrate can be improved by the light-reflective pattern, and the influence of the first gate signal lines and the data signal lines which have lower light transmittance on the light transmittance of the array substrate can be reduced. In this way, the problem of a poor display effect of a display panel adopting the array substrate in some practices can be solved, and the display effect of the display panel can be improved.

The embodiments of the present disclosure further provide a display panel, and the display panel includes an array substrate 100 and a color film substrate facing each other, and a liquid crystal layer disposed between the array substrate 100 and the color film substrate. The array substrate 100 is the array substrate 100 in any one of the above embodiments.

Figure 42:
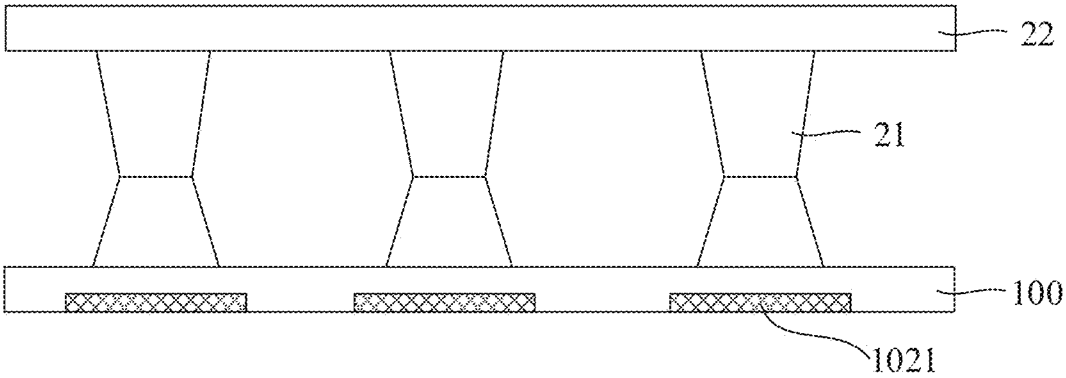
FIG. 42 is a schematic structural diagram of a display panel according to some embodiments of the present disclosure.

FIG. 42 is a schematic structural diagram of a display panel according to some embodiments of the present disclosure. Referring to FIG. 42, in some embodiments, the display panel further includes a plurality of support portions 21 disposed between the array substrate 100 and the color film substrate 22. The orthographic projection of at least one support portion 21 of the plurality of support portions 21 on the base 101 is within the orthographic projection of the reflective portion 1021 on the base 101. The support portions 21 play an isolation function, which can uniformly maintain the gaps between the array substrate 100 and the color film substrate 22. The size of the orthographic projection of the support portion 21 on the base 101 is smaller than the size of the orthographic projection of the reflective portion 1021 on the base 101 by 1 μm to 5 μm. In this way, by laminating the reflective portion 1021 and the support portion 21, the influence of the light-reflective pattern 102 on the light transmittance of the array substrate 100 can be reduced, thereby reducing the influence of the light-reflective pattern 102 on the aperture ratio of the display panel.

Figure 43:
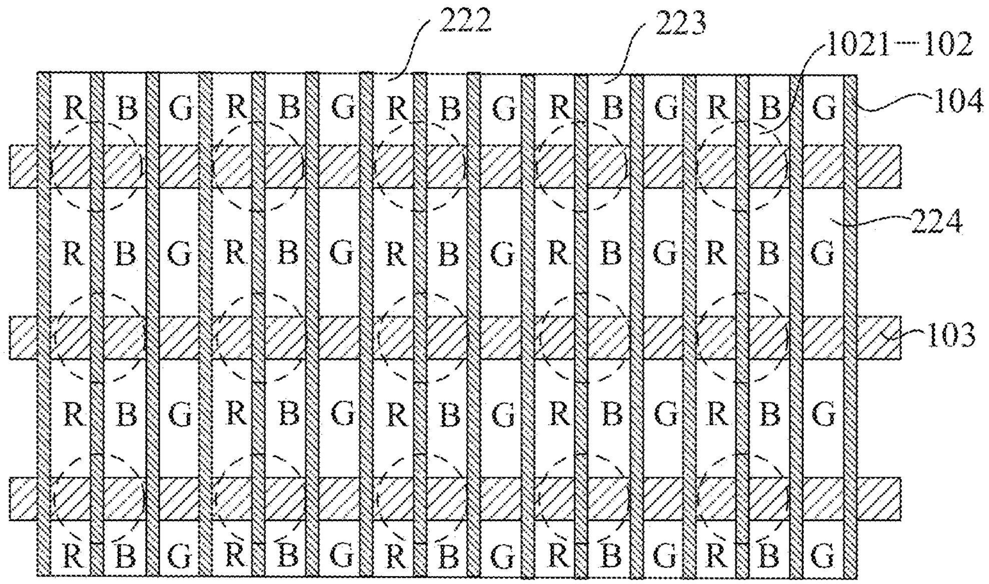
FIG. 43 is a schematic structural diagram of another display panel according to some embodiments of the present disclosure.
Figure 44:
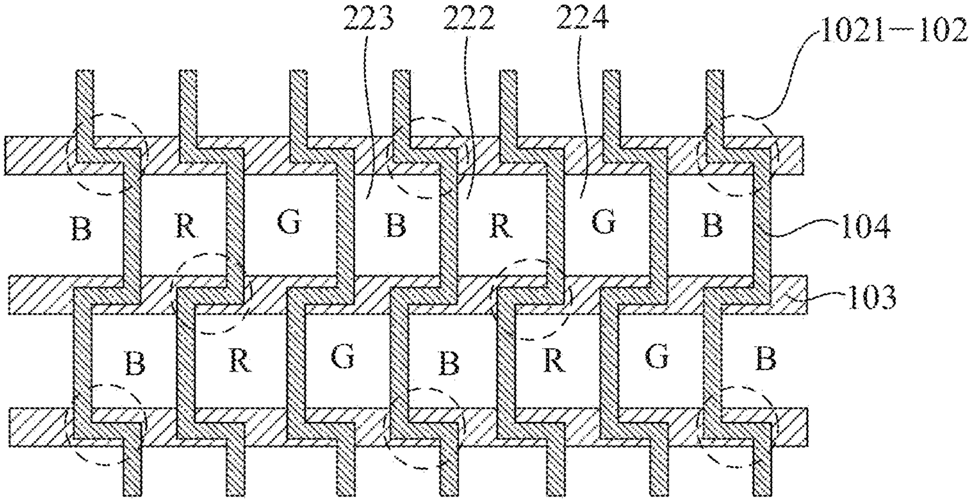
FIG. 44 is a schematic structural diagram of still another display panel according to some embodiments of the present disclosure.

FIG. 43 is a schematic structural diagram of another display panel according to some embodiments of the present disclosure; and FIG. 44 is a schematic structural diagram of still another display panel according to some embodiments of the present disclosure. Referring to FIG. 43 and FIG. 44, in some embodiments, the color film substrate 22 includes a plurality of red (R) color resistance blocks 222, a plurality of blue (B) color resistance blocks 223, and a plurality of green (G) color resistance blocks 224. The orthographic projection of the reflective portion 1021 on the base 101 overlaps with the orthographic projection of at least one red color resistance block 222 of the plurality of red color resistance blocks 222 on the base 101, the orthographic projection of the reflective portion 1021 on the base 101 overlaps with the orthographic projection of at least one blue color resistance block 223 of the plurality of blue color resistance blocks 223 on the base 101, and the orthographic projection of the reflective portion 1021 on the base 101 is staggered with the orthographic projections of the green color resistance blocks 224 on the base 101. Since the display panel has a lower light transmission for green light rays, by setting the orthographic projection of the reflective portion 1021 on the base 101 to be staggered with the orthographic projections of the green color resistance blocks 224 on the base 101, the influence of the reflective portion 1021 on the overall light output effect of the display panel can be reduced. It is to be understood that FIG. 44 shows the first gate signal lines 103 and the data signal lines 104 in the array substrate in order to clearly show the pixel regions on the display panel.

Referring to FIG. 44, two adjacent rows of pixel regions p1 in the display panel shown in FIG. 44 are arranged in a staggered manner, and for the arrangement the plurality of reflective portions 1021 in the first direction f1 and the second direction f2, reference can be made to the arrangement of the plurality of reflective portions 1021 shown in FIG. 1.

In summary, the embodiments of the present disclosure provide a display panel, including an array substrate and a color film substrate. The array substrate includes a base, a light-reflective pattern, a plurality of first gate signal lines, and a plurality of data signal lines. The light-reflective pattern includes a plurality of reflective portions and an opening region is defined between two adjacent reflective portions. Since the first gate signal lines and the data signal lines are film layers having lower light transmittance, the light-reflective pattern overlaps at least partially with the first gate signal lines and the data signal lines, and when light rays from a light source are irradiated to the light-reflective pattern, the light-reflective pattern can reflect the light rays from the light source to the other film layers. The other film layers reflect at least part of the light rays from the light source towards the side of the light-reflective pattern away from the base. Thus, the backlight utilization rate of the display panel including the array substrate can be improved by the light-reflective pattern, and the influence of the first gate signal lines and the data signal lines which have lower light transmittance on the light transmittance of the array substrate can be reduced. In this way, the problem of a poor display effect of a display panel adopting the array substrate in some practices can be solved, and the display effect of the display panel can be improved.

The term "and/or" in the present disclosure merely describes an association relationship between associated objects, which represents that there may exist three types of relationships. For example, A and/or B represents three situations: A exists alone, A and B exist simultaneously, and B exists alone. The character "/" herein generally represents an "or" relationship between the associated objects before and after the character.

The term "at least one of A and B" in the present disclosure merely describes an association relationship between associated objects, which represents that there may exist three types of relationships. For example, at least one of A and B represents three situations: A exists alone, A and B exist simultaneously, and B exists alone. Similarly, "at least one of A, B, and C" represents seven types of relationships: A exists alone, B exists alone, C exists alone, A and B exist simultaneously, A and C exist simultaneously, C and B exist simultaneously, and A, B, and C exist simultaneously. Similarly, "at least one of A, B, C and D" represents fifteen types of relationships: A exists alone, B exists alone, C exists alone, D exists alone, A and B exist simultaneously, A and C exist simultaneously, A and D exist simultaneously, C and B exist simultaneously, D and B exist simultaneously, C and D exist simultaneously, A, B and C exist simultaneously, A, B and D exist simultaneously, A, C and D exist simultaneously, B, C and D exist simultaneously, and A, B, C and D exist simultaneously.

It should be noted that in the drawings, the dimensions of layers and regions may be exaggerated for clarity of illustration. It is to be further understood that when an element or layer is referred to as being "on" another element or layer, it may be directly on other elements, or an intermediate layer may be present. Additionally, it is to be understood that when an element or layer is referred to as being "under" another element or layer, it may be directly under other elements, or more than one intermediate layer or element may be present. Additionally, it is to be understood that when a layer or element is referred to as being "between" two layers or two elements, it may be the unique layer between the two layers or two elements, or more than one intermediate layer or element may be present. Similar reference numerals indicate similar elements throughout.

In the present disclosure, the terms "first" and "second" are used for descriptive purposes only and are not to be construed as indicating or implying relative importance. The term "a plurality of" refers to two or more, unless otherwise expressly specified.

Described above are merely optional embodiments of the present disclosure, and are not intended to limit the present disclosure. Within the spirit and principles of the present disclosure, any modifications, equivalent substitutions, improvements, and the like are within the protection scope of the present disclosure.

The invention claimed is:

1. An array substrate, comprising:

a base;

a light-reflective pattern disposed on the base, wherein the light-reflective pattern comprises a plurality of reflective portions, and an opening region is defined between two adjacent reflective portions of the plurality of reflective portions;

a plurality of first gate signal lines disposed on a side of the light-reflective pattern away from the base; and a plurality of data signal lines disposed on a side of the plurality of first gate signal lines away from the base; wherein an orthographic projection of the first gate signal line on the base and an orthographic projection of the data signal line on the base have a first overlapping region, and at least one first overlapping region of a plurality of first overlapping regions is within an orthographic projection of the reflective portion on the base;

the plurality of reflective portions comprise a plurality of reflective portion groups, one reflective portion group comprises two rows of reflective portions, the plurality of reflective portion groups are arranged along a first direction, the two rows of reflective portions in one reflective portion group are arranged along the first direction, and the plurality of reflective portions in one row of reflective portions are arranged along a second direction, wherein the first direction is an extension direction of the data signal line, and the second direction is an extension direction of the first gate signal line; and in one reflective portion group, orthographic projections of the plurality of reflective portions in one row of reflective portions on the base are circular in shape, and orthographic projections of the plurality of reflective portions in the other row of reflective portions on the base are rectangular in shape.

2. The array substrate according to claim 1, further comprising: a buffer layer, a second active layer pattern, a first gate insulating layer, a plurality of second gate signal lines, a first interlayer dielectric layer, and a first active layer pattern which are disposed between the plurality of first gate signal lines and the light-reflective pattern; wherein the buffer layer, the second active layer pattern, the first gate insulating layer, the plurality of second gate signal lines, the first interlayer dielectric layer, and the first active layer pattern are laminated in a direction going away from the base.

3. The array substrate according to claim 2, further comprising: a light-shielding pattern disposed between the light-reflective pattern and the first active layer pattern; wherein the first active layer pattern comprises a plurality of first active layers, wherein the first active layer has a channel region, and an orthographic projection of the channel region on the base is within an orthographic projection of the light-shielding pattern on the base; and the orthographic projection of the light-shielding on the base overlaps with an orthographic projection of the light-reflective pattern on the base.

4. The array substrate according to claim 2, wherein a material of the light-reflective pattern comprises at least one of molybdenum, aluminum, titanium and argentum, and a thickness of the light-reflective pattern ranges from 50 angstroms to 2000 angstroms.

5. The array substrate according to claim 1, further comprising: a buffer layer, a second active layer pattern, a first gate insulating layer, a plurality of second gate signal lines, a first interlayer dielectric layer, and a first active layer pattern which are disposed on a side of the plurality of first gate signal lines close to the base; wherein the buffer layer, the second active layer pattern, the first gate insulating layer, the plurality of second gate signal lines, the first interlayer dielectric layer and the first active layer pattern are laminated in a direction going away from the base; and the light-reflective pattern and the plurality of second gate signal lines are disposed in a same layer.

6. The array substrate according to claim 5, wherein a material of the light-reflective pattern comprises at least one of molybdenum, aluminum and titanium, and a thickness of the light-reflective pattern ranges from 1500 angstroms to 6000 angstroms.

7. The array substrate according to claim 1, wherein the plurality of reflective portions are arranged in an array, the data signal line extends along a first direction, the plurality of data signal lines are arranged along a second direction, the first gate signal line extends along the second direction, and the plurality of first gate signal lines are arranged along the first direction;

the plurality of reflective portions satisfy the following formula:

$$L_1 = n \times H;$$

$$L_2 = 3n \times W;$$

wherein $L_1$ represents a distance between centers of two reflective portions adjacent in the first direction, H represents a shortest distance between centers of two adjacent first gate signal lines in the first direction, and n is a positive integer greater than or equal to 1; and $L_2$ represents a distance between centers of two reflective portions adjacent in the second direction, and W represents a shortest distance between centers of two adjacent data signal lines in the second direction.

8. The array substrate according to claim 7, wherein the plurality of first gate signal lines and the plurality of data signal lines satisfy the following formula:

$$D_1/D_2 \geq 1.3;$$

wherein $D_1$ represents a distance between two adjacent first gate signal lines, and $D_2$ represents a distance between two adjacent data signal lines.

9. The array substrate according to claim 1, wherein the plurality of reflective portions are arranged in a plurality of rows, the plurality of rows of reflective portions are arranged along a first direction, and the plurality of reflective portions in one row of reflective portions are arranged along a second direction, wherein the first direction is an extension direction of the data signal line, and the second direction is an extension direction of the first gate signal line; and the plurality of reflective portions in two adjacent rows of reflective portions are arranged in a staggered manner.

10. The array substrate according to claim 1, wherein the plurality of reflective portions are arranged in a plurality of rows, the plurality rows of reflective portions are arranged along a first direction, and the plurality of reflective portions in one row of reflective portions are arranged along a second direction, wherein the first direction is an extension direction of the data signal line, and the second direction is an extension direction of the first gate signal line;

one row of reflective portions comprises a plurality of first reflective portions and a plurality of second reflective portions, and the plurality of first reflective portions and the plurality of second reflective portions are arranged alternately along the second direction;

the first overlapping region has a first side and a second side opposite to each other in the first direction, wherein a center of an orthographic projection of the first reflective portion on the base is at the first side of a center of the first overlapping region, and a center of an orthographic projection of the second reflective portion on the base is at the second side of the center of the first overlapping region.

11. The array substrate according to claim 1, wherein a shape of the orthographic projection of the reflective portion on the base comprises at least one of a circle, an ellipse, a square and a square hexagon.

12. The array substrate according to claim 1, wherein the orthographic projection of the reflective portion on the base is rectangular in shape, the plurality of reflective portions are in one-to-one correspondence with the plurality of first overlapping regions, and the first overlapping region is in the orthographic projection of the corresponding reflective portion on the base; and a difference value between a width of the reflective portion in a first direction and a width of the first overlapping region in the first direction ranges from 1 μm to 8 μm, and a difference value between a width of the reflective portion in a second direction and a width of the first overlapping region in the second direction ranges from 1 μm to 6 μm;

wherein the first direction is an extension direction of the data signal line, and the second direction is an extension direction of the first gate signal line.

13. The array substrate according to claim 12, wherein the plurality of reflective portions are arranged in a plurality of rows, the plurality of rows of reflective portions are arranged along the first direction, and the plurality of reflective portions in one row of reflective portions are arranged along the second direction;

the light-reflective pattern further comprises a plurality of connection portions, wherein the connection portion is disposed between two adjacent reflective portions in one row of reflective portions and is connected to the two adjacent reflective portions; and an orthographic projection of the connection portion on the base is within an orthographic projection of the first gate signal line on the base.

14. The array substrate according to claim 12, wherein the reflective portion comprises a reflective portion body and two first protruding structures, wherein the two first protruding structures are respectively disposed on two sides of the reflective portion body in the second direction, and an opening region is defined between the first protruding structures of two reflective portions adjacent in the second direction; and an orthographic projection of the first protruding structure on the base is within the orthographic projection of the first gate signal line on the base.

15. The array substrate according to claim 12, wherein the plurality of reflective portions are arranged in a plurality of rows, the plurality of rows of reflective portions are arranged along the first direction, and the plurality of reflective portions in one row of reflective portions are arranged along the second direction;

one row of reflective portions comprises a plurality of reflective portion units, and each of the plurality of reflective portion units comprises a plurality of reflective portions; and in two adjacent reflective portion units, the reflective portions in one reflective portion unit have a first length in the first direction, and the reflective portions in the other reflective portion unit have a second length in the first direction, the first length being greater than the second length.

16. A method for manufacturing an array substrate, comprising:

forming a light-reflective pattern on a base, wherein the light-reflective pattern comprises a plurality of reflective portions, and an opening region is defined between two adjacent reflective portions of the plurality of reflective portions;

forming a plurality of first gate signal lines on the base on which the light-reflective pattern is formed; and forming a plurality of first data signal lines on the base on which the plurality of first gate signal lines are formed; wherein an orthographic projection of the first gate signal line on the base and an orthographic projection of the data signal line on the base have a first overlapping region, and an orthographic projection of the reflective portion on the base overlaps with the first overlapping region;

the plurality of reflective portions comprise a plurality of reflective portion groups, one reflective portion group comprises two rows of reflective portions, the plurality of reflective portion groups are arranged along a first direction, the two rows of reflective portions in one reflective portion group are arranged along the first direction, and the plurality of reflective portions in one row of reflective portions are arranged along a second direction, wherein the first direction is an extension direction of the data signal line, and the second direction is an extension direction of the first gate signal line; and in one reflective portion group, orthographic projections of the plurality of reflective portions in one row of reflective portions on the base are circular in shape, and orthographic projections of the plurality of reflective portions in the other row of reflective portions on the base are rectangular in shape.

17. A display panel, comprising: an array substrate and a color film substrate facing each other, and a liquid crystal layer disposed between the array substrate and the color film substrate, wherein the array substrate comprises:

a base;

a light-reflective pattern disposed on the base, wherein the light-reflective pattern comprises a plurality of reflective portions, and an opening region is defined between two adjacent reflective portions of the plurality of reflective portions;

a plurality of first gate signal lines disposed on a side of the light-reflective pattern away from the base; and a plurality of data signal lines disposed on a side of the plurality of first gate signal lines away from the base; wherein an orthographic projection of the first gate signal line on the base and an orthographic projection of the data signal line on the base have a first overlapping region, and at least one first overlapping region of a plurality of first overlapping regions is within an orthographic projection of the reflective portion on the base;

the plurality of reflective portions comprise a plurality of reflective portion groups, one reflective portion group comprises two rows of reflective portions, the plurality of reflective portion groups are arranged along a first direction, the two rows of reflective portions in one reflective portion group are arranged along the first direction, and the plurality of reflective portions in one row of reflective portions are arranged along a second direction, wherein the first direction is an extension direction of the data signal line, and the second direction is an extension direction of the first gate signal line; and in one reflective portion group, orthographic projections of the plurality of reflective portions in one row of reflective portions on the base are circular in shape, and orthographic projections of the plurality of reflective portions in the other row of reflective portions on the base are rectangular in shape.

18. The display panel according to claim 17, further comprising: a plurality of support portions disposed between the array substrate and the color film substrate, wherein an orthographic projection of at least one support portion of the plurality of support portions on the base is within the orthographic projection of the reflective portion on the base.

19. The display panel according to claim 17, wherein the color film substrate comprises a plurality of red color resistance blocks, a plurality of blue color resistance blocks and a plurality of green color resistance blocks; wherein the orthographic projection of the reflective portion on the base overlaps with an orthographic projection of at least one red color resistance block of the plurality of red color resistance blocks on the base, the orthographic projection of the reflective portion on the base overlaps with an orthographic projection of at least one blue color resistance block of the plurality of blue color resistance blocks on the base, and the orthographic projection of the reflective portion on the base is staggered with orthographic projections of the green color resistance blocks on the base.

* * * * *